(12) United States Patent
Maeda

(10) Patent No.: US 6,204,682 B1
(45) Date of Patent: *Mar. 20, 2001

(54) TFT AND RELIABILITY EVALUATION METHOD THEREOF

(75) Inventor: Shigenobu Maeda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/437,091

(22) Filed: Nov. 9, 1999

Related U.S. Application Data

(60) Division of application No. 08/781,254, filed on Jan. 10, 1997, now Pat. No. 6,020,753, which is a continuation-in-part of application No. 08/666,176, filed on Jun. 19, 1996, now abandoned, which is a division of application No. 08/514,340, filed on Aug. 11, 1995, now abandoned, which is a continuation of application No. 08/210,402, filed on Mar. 18, 1994, now abandoned.

(30) Foreign Application Priority Data

May 13, 1993 (JP) .................................................. 5-111790

(51) Int. Cl.$^7$ .................................................. G01R 31/26
(52) U.S. Cl. .......................................... 324/769; 702/170
(58) Field of Search .......................... 324/765, 766, 324/769, 770; 702/64, 65, 170

(56) References Cited

U.S. PATENT DOCUMENTS

| | | | |
|---|---|---|---|
| 4,495,558 | * 1/1985 | Cath et al. ........................... | 702/170 |
| 5,428,300 | 6/1995 | Takahashi et al. ................... | 324/769 |
| 5,485,097 | * 1/1996 | Wang .................................... | 324/765 |
| 5,561,387 | * 10/1996 | Lee ....................................... | 324/765 |
| 5,608,338 | 3/1997 | Maeda ................................. | 324/770 |
| 5,650,336 | 7/1997 | Eriguchi et al. ...................... | 324/719 |

OTHER PUBLICATIONS

"Evaluation of Hot Carrier Effects in TFT by Emission Microscopy" by Komori et al., International Reliability Physics Proceedings, 1992, pp. 63–67, (month unavailable).

"Surface State Formation During Long–Term Bias–Temperature Stress Aging of Thin $SiO_2$–Si Interfaces", Shiono et al., Japanese Journal of Applied Physics, vol. 18, No. 6, Jun. 1979, pp. 1087–1095.

\* cited by examiner

*Primary Examiner*—Glenn W. Brown
(74) *Attorney, Agent, or Firm*—McDermott, Will & Emery

(57) ABSTRACT

In a method of evaluating the reliability of a thin film transistor (TFT), time coefficient β, voltage coefficient d and temperature coefficient $\phi_0$ are experimentally produced from –BT stress tests, and the life of a TFT under –BT stress conditions is evaluated using the following expression:

$$\tau = t_0 \left(\frac{\Delta V_{th\tau}}{\Delta V_{th0}}\right)^\beta \exp\frac{\beta q \phi_0}{kT} \exp\left(-\frac{\beta q d |V_G|}{2kTt_{OX}}\right) \qquad (8)$$

where τ represents the life time of the TFT, $\Delta V_{th\tau}$ the tolerant threshold voltage shift amount of the TFT, $t_0$ $(1/\Delta V_{th0})$ constant, q elementary electric charge, k Boltzmann constant, T temperature, $V_G$ gate voltage, and $t_{OX}$ the thickness of the gate oxide film.

5 Claims, 17 Drawing Sheets

(A)     (B)

TFT AND RELIABILITY EVALUATION METHOD THEREOF

This application is a divisional of application Ser. No. 08/781,254 filed Jan. 10, 1997, now U.S. Pat. No. 6,020,753, which is a Continuation-In-Part of application Ser. No. 08/666,176, filed Jun. 19, 1996, now abandoned, which is a Divisional of application Ser. No. 08/514,340, filed Aug. 11, 1995, now abandoned, which is a Continuation of application Ser. No. 08/210,402, filed Mar. 18, 1994, now abandoned.

BACKGROUND OF THE INVENTION

1. Field of the Invention

The present invention relates generally to thin film transistors (TFT) and methods of evaluating reliability thereof, and more specifically, to a TFT including a channel layer of a silicon thin film and a gate insulating film of a silicon oxide film, and a method of evaluating reliability thereof.

2. Description of the Background Art

TFTs are used for load transistors in the memory cells of a static random access memory (SRAM) or driver transistors for liquid crystal television pixels. When such products incorporated with TFTs are marketed, the reliability of TFTs should be evaluated.

In FIG. 22, a typical top gate type P channel TFT is illustrated in a schematic cross section. In the TFT, an insulating film 2a is formed on a substrate 1. A polysilicon film 3 is formed on insulating film 2a. Polysilicon film 3 may be replaced with a monocrystalline silicon film or an amorphous silicon film. Source/drain regions 4 and a channel region 5 are included in polysilicon layer 3. A gate electrode 7 is formed on polysilicon layer 3 with a gate insulating film 6 of a silicon oxide film therebetween. Polysilicon layer 3 and gate electrode 7 are covered with a silicon oxide film 2b. An aluminum interconnection 8 is connected to each of source/drain regions 4 through a contact hole provided in silicon oxide film 2b. More specifically, the TFT in FIG. 22 is an MOS (Metal Oxide Semiconductor) type FET (Field Effect Transistor) with polysilicon layer 3 serving as an active region.

For reliability evaluation tests for the TFT as illustrated in FIG. 22, a hot carrier stress test, a breakdown voltage test for gate insulating film 6 or the like have been conducted.

FIG. 23 sets forth one example of a bias condition in such a hot carrier stress test. In this example, source voltage $V_S$ applied to source S is 0V, gate voltage $V_G$ applied to gate G is -7V, drain voltage $V_D$ applied to drain D is -7V, and current continues to be passed between source S and drain D for a long period of time. It has been established that if polysilicon film 3 is sufficiently hydrogenated, the electrical characteristic of the TFT hardly changes before and after such a hot carrier stress test (see International Reliability Physics Society Proceedings, 1992, pp. 63–67).

In FIG. 24, one example of a breakdown voltage evaluation test for a gate insulating film in a TFT is illustrated. In this example, for $V_S=V_D=0V$, gate voltage $V_G$ is gradually changed from 0V toward negative voltage. At the time, the gate voltage $V_G$ at which gate insulating film 6 is broken down is called gate breakdown voltage. When a silicon oxide film as thick as 250 Å is used for a gate insulating film, the gate breakdown voltage is about 25V. For a power supply voltage of 5V, a gate breakdown voltage of 25V would be enough. The insulation breakdown voltage of a silicon oxide film is generally about 10 MV/cm expressed in electric field, and a breakdown voltage for a gate insulating film having an arbitrary thickness can be estimated from the value of the electric field.

It has been known that in a bulk silicon monocrystalline MOSFET the characteristic of the bulk MOSFET slightly degrades by a -BT (negative bias temperature) stress test by which the gate is supplied with constant voltage $V_G$ and maintained at an elevated constant temperature T.

The influence of -BT stress however is not exactly known. TFTs are therefore incorporated in SRAMs and the like and marketed without reliability evaluation by -BT stress tests.

SUMMARY OF THE INVENTION

It is therefore an object of the invention to ascertain the influence of -BT stress upon a TFT and establish a method of evaluating reliability concerning the degradation of the characteristic of a TFT due to -BT stress.

Another object of the invention is to provide a TFT satisfying reliability required in a -BT stress state based on thus established method of evaluating the reliability of a TFT due to -BT stress.

A method of evaluating the reliability of a TFT according to a first aspect of the invention, in a TFT having a channel layer of a silicon thin film and a gate insulating film of a silicon oxide film, evaluates the reliability of the TFT in the -BT stress state in which the gate is supplied with an arbitrary negative constant voltage $V_G$ and maintained at an arbitrary constant temperature T based on the following expressions:

$$\Delta V_{th} \, t^\alpha \tag{3a}$$

$$\Delta V_{th} \propto \exp\frac{qd|V_G|}{2kTt_{ox}} \tag{4a}$$

$$\Delta V_{th} \propto \exp\left\{-\frac{q}{kT}\left(\phi_0 - \frac{d|V_G|}{2t_{ox}}\right)\right\} \tag{5a}$$

$$\Delta V_{th} = \Delta V_{th0}\left(\frac{t}{t_0}\right)^\alpha \exp\left\{-\frac{q}{kT}\left(\phi_0 - \frac{d|V_G|}{2t_{ox}}\right)\right\} \tag{6}$$

$$\tau = t_0\left(\frac{\Delta V_{th\tau}}{\Delta V_{th0}}\right)^\beta \exp\frac{\beta q \phi_0}{kT} \exp\left(-\frac{\beta q d|VG|}{2kTt_{OX}}\right) \tag{8}$$

where $\Delta V_{th}$ represents the threshold voltage shift amount of the TFT, t time, α time coefficient, q elementary electric charge, d voltage coefficient, k Boltzmann constant, $t_{ox}$ the thickness of the gate oxide film, $\phi_0$ temperature coefficient, and $\Delta V_{th\tau}$ tolerant threshold voltage shift amount for the TFT, and β=1/α. The method includes a step of determining time coefficient α in expression (3a) based on the relation between threshold voltage shift amount $\Delta V_{th}$ obtained from at least one -BT stress test and time t, a step of determining voltage coefficient d in expression (4) based on the relation between threshold voltage shift amounts $\Delta V_{th}$ obtained from at least two -BT stress tests and applied different gate voltages $V_G$, a step of determining temperature coefficient $\phi_0$ in expression (5a) based on the relation between threshold voltage shift amounts $\Delta V_{th}$ obtained from at least two -BT stress tests and applied different temperatures T, and a step of determining a constant of proportion given as follows using the determined time coefficient α, voltage coefficient d, and temperature coefficient $\phi_0$ determined in expression (6) obtained from the relation between expression (3a), (4a), and (5a), $$\Delta V_{thO}\left(\frac{1}{t_0}\right)^\alpha \equiv C_2$$

and is characterized in that the life of a TFT is produced from expression (8) obtained by modifying expression (6) from the determined constant proportion $c_2$ and tolerant threshold voltage shift amount $\Delta V_{th\tau}$.

A method of evaluating the reliability of a TFT according to a second aspect of the invention, in a TFT having a channel layer of a silicon thin film and a gate insulating film of a silicon oxide film, evaluates the reliability of the TFT in the −BT stress state in which the gate is supplied with an arbitrary constant voltage $V_G$ and held at a predetermined constant temperature T based on the following expressions:

$$\Delta V_{th} t^\alpha \tag{3a}$$

$$\Delta V_{th} \propto \exp\frac{qd|V_G|}{2kTt_{ox}} \tag{4a}$$

$$\Delta V_{th} = \Delta V_{thO}\left(\frac{t}{t_0}\right)^\alpha \exp\frac{qd|V_G|}{2kT_0 t_{ox}} \tag{6b}$$

$$\tau = t_0\left(\frac{\Delta V_{th\tau}}{\Delta V_{thO}}\right)^\beta \exp\left(-\frac{\beta qd|VG|}{2kT t_{OX}}\right) \tag{8b}$$

where $\Delta V_{th}$ represents the threshold voltage shift amount of the TFT, t time, α time coefficient, q elementary electric charge, k Boltzmann constant, $t_{OX}$ the thickness of the gate oxide film, $\phi_0$ temperature coefficient, and $\Delta V_{th\tau}$ tolerant threshold voltage shift amount for the TFT, and β=1/α. The method includes a step of determining time coefficient α in expression (3a) based on the relation between threshold voltage shift amount $\Delta V_{th}$ obtained from at least one −BT stress test and time t, a step determining a constant of proportion given as follows using the determined time coefficient α and voltage coefficient d in expression (6b) obtained from the relation between expressions (3a) and (4a), $$\Delta V_{thO}\left(\frac{1}{t_0}\right)^\alpha \equiv C_2$$

and the method is characterized in that the life of the TFT is produced from expression (8b) obtained by modifying expression (6b) from the determined constant of proportion $c_2$ and tolerant threshold voltage shift amount $\Delta V_{th\tau}$ for the TFT.

A method of evaluating the reliability of a TFT according to a third aspect of the invention in a TFT having a channel layer of a silicon thin film and a gate insulating film of a silicon oxide film evaluates the reliability of the TFT in the −BT stress state in which the gate is supplied with a predetermined negative constant voltage $V_G$ and maintained at an arbitrary constant temperature T using the following expressions:

$$\Delta V_{th} t^\alpha \tag{3a}$$

$$\Delta V_{th} \propto \exp\left(-\frac{q\phi E}{kT}\right) \tag{5b}$$

$$\Delta V_{th} = \Delta V_{thO}\left(\frac{t}{t_0}\right)^\alpha \exp\left(-\frac{q\phi_E}{kT}\right) \tag{6c}$$

$$\tau = t_0\left(\frac{\Delta V_{th\tau}}{\Delta V_{thO}}\right)^\beta \exp\frac{\beta q\phi_E}{kT} \tag{8c}$$

where $\Delta V_{th}$ represents a threshold voltage shift amount for the TFT, t time, α time coefficient, k Boltzmann constant, $\phi_E$ temperature coefficient, and $\Delta V_{th\tau}$ tolerant threshold voltage shift amount for the TFT, and β=1/α. The method includes a step of determining time coefficient α in expression (3a) based on the relation between threshold voltage shift amount $\Delta V_{th}$ obtained from at least one −BT stress test and time t, a step of determining temperature coefficient $\phi_E$ in expression (5b) based on the relation between threshold voltage shift amounts $\Delta V_{th}$ obtained from at least two −BT stress tests and applied different temperatures T, and a step of determining a constant of proportion given as follows using the determined time coefficient α and temperature coefficient $\phi_E$ in expression (6c) obtained from the relation between expressions (3a) and (5b), $$\Delta V_{thO}\left(\frac{1}{t_0}\right)^\alpha \equiv C_2$$

and the method is characterized in that the life of the TFT is produced from expression (8c) obtained by modifying expression (6c) from the determined constant of proportion $c_2$ and tolerant threshold voltage shift amount $\phi V_{th\tau}$ for the TFT.

A TFT according to a fourth aspect of the invention is used for an SRAM memory cell, includes a channel layer of a silicon thin film and a gate insulating film of a silicon oxide film, and is characterized in that the threshold voltage is shifted in advance toward positive voltage by the amount by which the threshold voltage is expected to shift toward negative voltage by a burn-in test.

A TFT according to a fifth aspect of the invention is operated by gate voltage $V_G$ and used under the condition that the temperature at the time of operation is an absolute temperature T and includes a channel layer of a silicon thin film, and a gate insulating film of a silicon oxide film. The gate insulating film has a thickness of $t_{OX}$=qd$|V_G|$2kT, wherein $t_{OX}$ represents the thickness of the gate insulating film, q elementary electric charge, d voltage coefficient, and k Boltzmann constant, and voltage coefficient d is determined using the following expression (4a) based on the relation between threshold voltage shift amounts $\Delta V_{th}$ obtained from at least two −BT stress tests and applied different gate voltages $V_G$, $$\Delta V_{th} \alpha \exp\frac{qd|V_G|}{2kTt_{ox}} \tag{4a}$$

where q represents elementary electric charge, k Boltzmann constant, and $t_{OX}$ the thickness of the gate insulating film.

In the method of evaluating the reliability of a TFT according to the first aspect of the invention, since life expected for the TFT is evaluated from expression (8) using time coefficient a, voltage coefficient d and temperature coefficient α, determined from −BT stress tests and expressions (3a), (4a), and (5a) the life expected for the TFT used with an arbitrary constant gate voltage $V_G$ at an arbitrary constant temperature T can readily and accurately be evaluated.

In the method of evaluating the reliability of a TFT according to the second aspect of the invention, since the TFT is limited for use at a predetermined constant temperature, life expected for the TFT can be evaluated without requiring at least two −BT stress tests at different temperatures T.

In the method of evaluating the reliability of a TFT according to the third aspect of the invention, since the TFT is limited for use at a predetermined constant gate voltage $V_G$, life expected for the TFT can be evaluated without requiring at least two −BT stress tests at different gate voltages $V_G$.

In the TFT according to the fourth aspect of the invention, since the threshold voltage is previously shifted toward the side of positive voltage by the amount of shift of the threshold voltage toward the side of negative voltage due to a burn-in test, a TFT for SRAM having an optimum characteristic can be provided after the burn-in test.

In the TFT according to the fifth aspect of the invention, since the gate insulating film has the thickness of $T_{OX}=qd|V_G|/2kT$, a TFT having a maximum life in a −BT stress state at arbitrary constant gate voltage $V_G$ and at an arbitrary constant temperature T can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The inventors have found for the first time that the degradation of the electric characteristic due to −BT stress causes a problem in a TFT. The −BT stress state is the state in which the gate of a TFT is supplied with a negative bias voltage and held at a relatively high temperature.

Figure 1:
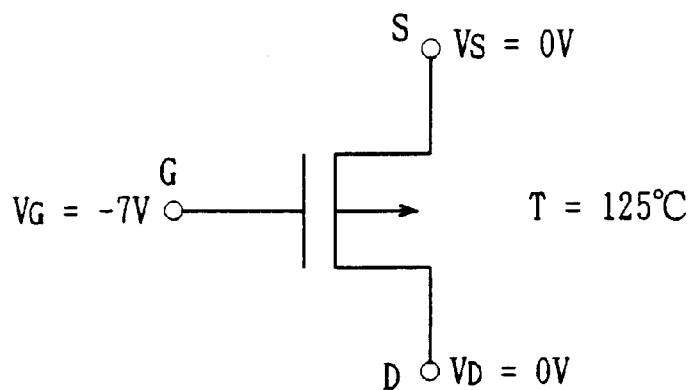
FIG. 1 is a diagram showing one example of a TFT in a −BT stress state.

In FIG. 1, one example of such a −BT stress state is illustrated. In this example, for $V_S=V_D=0V$, a TFT having its gate G supplied with gate voltage $V_G$ of −7V is held at 125° C. for a long period of time. It has been found out that such −BT stress causes threshold voltage $V_{th}$ to shift toward negative voltage in the order of 0.1V for $10^4$ sec.

Figure 2:
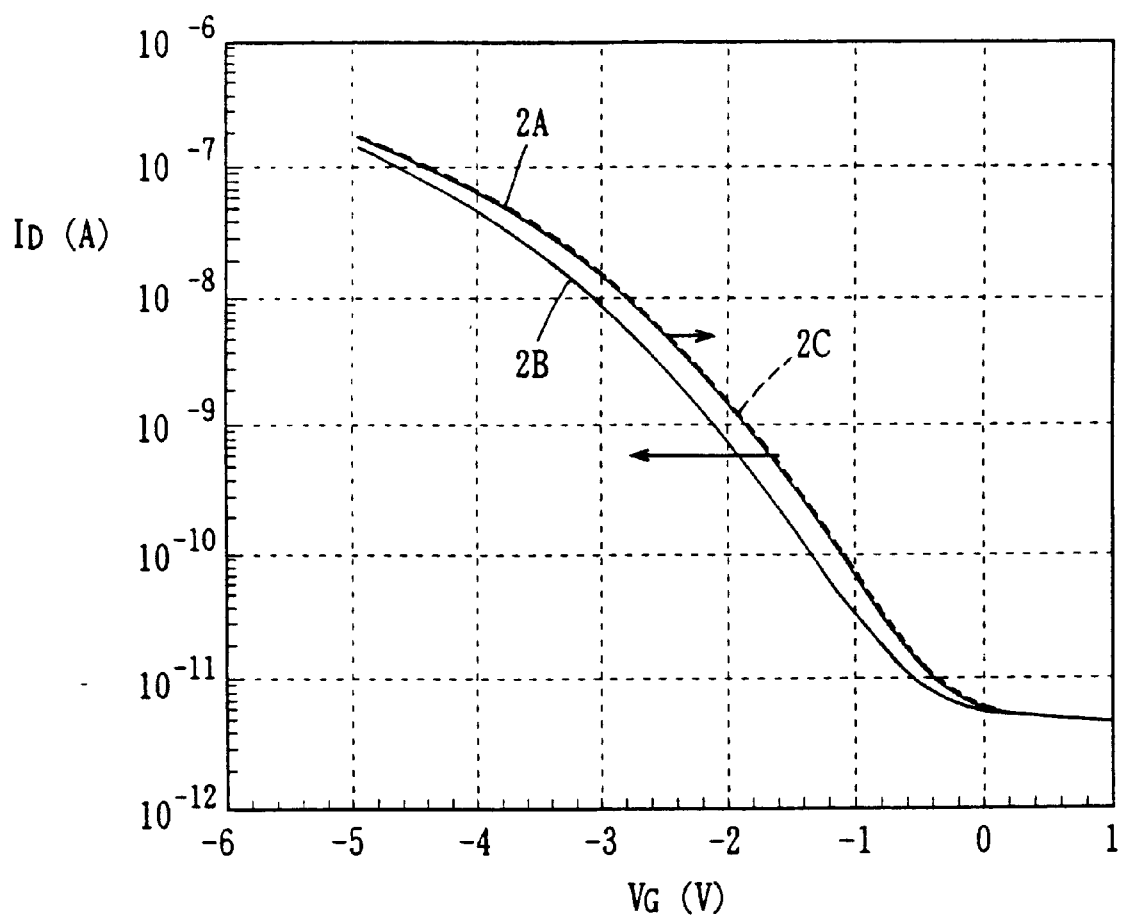
FIG. 2 is a graph showing the shift of TFT due to −BT stress.

FIG. 2 is a graph showing the result of a test in the −BT stress state illustrated in FIG. 1. In the graph, the abscissa represents gate voltage $V_G$ (V), and the ordinate represents drain current $I_D$ (A). Curve 2A represents the $I_D$-$V_G$ characteristic of a TFT before the −BT stress test. Curve 2B represents the $I_D$-$V_G$ characteristic after passage of $3\times10^4$ sec since the initiation of −BT stress test. Dotted curve 2C represents for reference $I_D$-$V_G$ characteristic after passage of $3\times10^4$ sec since the initiation of +BT stress test for $V_G=+7V$. As can be seen from a comparison between curves 2A, 2B, and 2C, in the +BT stress test, the $I_D$-$V_G$ characteristic hardly changes, but in the −BT stress test, the threshold voltage $V_{th}$ changes by about −0.3V. Stated differently, after the −BT stress test, drain current $I_D$ drops.

Figure 23:
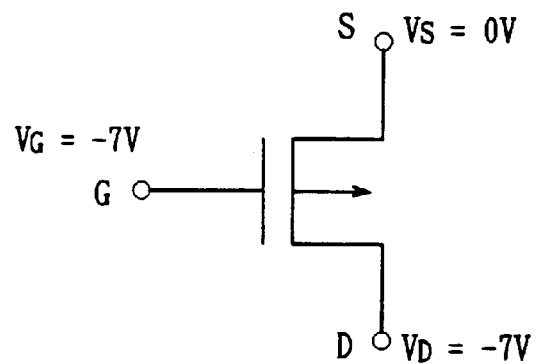
FIG. 23 is a diagram showing one example of a hot carrier stress condition.
Figure 24:
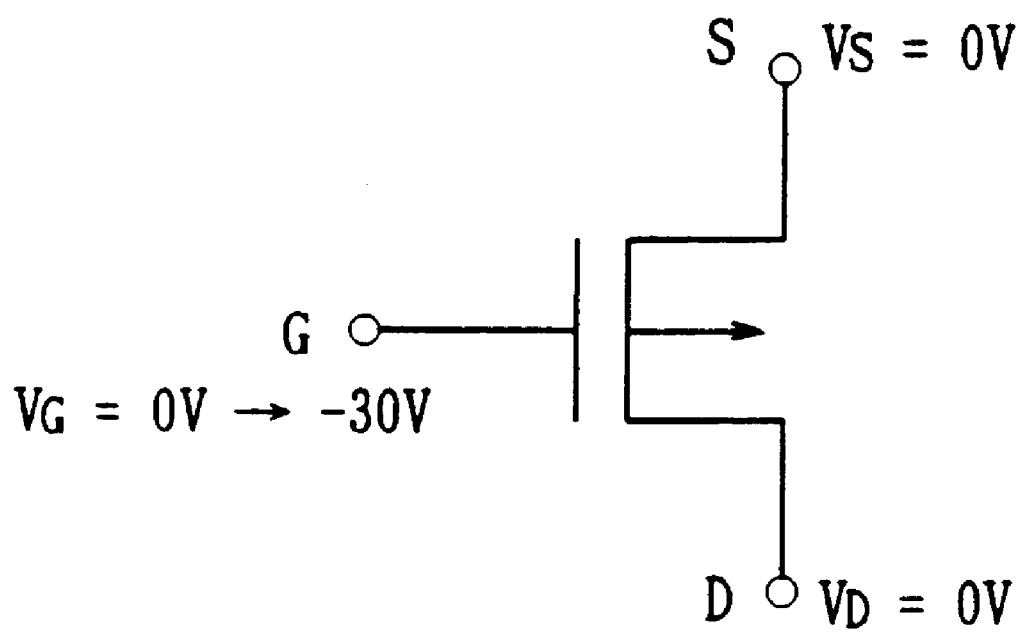
FIG. 24 is a representation for use in illustration of one example of gate breakdown voltage measurement.

The amount of shift of threshold voltage $\Delta V_{th}$ due to the −BT stress is greater than the case of a hot carrier stress test illustrated in FIG. 23 using the same gate voltage $V_G$.

When TFTs operate as part of a CMOS (Complimentary MOS) circuit, a P channel TFT is put under the same bias condition as −BT stress at a higher time ratio, and therefore drain current does not continue to flow unlike the case of the hot carrier stress state.

It can be understood from the above that the influence of −BT stress upon a TFT in terms of the reliability of the TFT is significant.

As described above, degradation due to −BT stress has already been known in a bulk monocrystalline MOSFET. In a polysilicon TFT, however, since dangling bonds of silicon in grain boundaries are partly responsible for degradation due to −BT stress, the degradation of the polysilicon TFT due to the −BT stress is about ten times as large as the case of the monocrystalline MOSFET.

Figure 3:
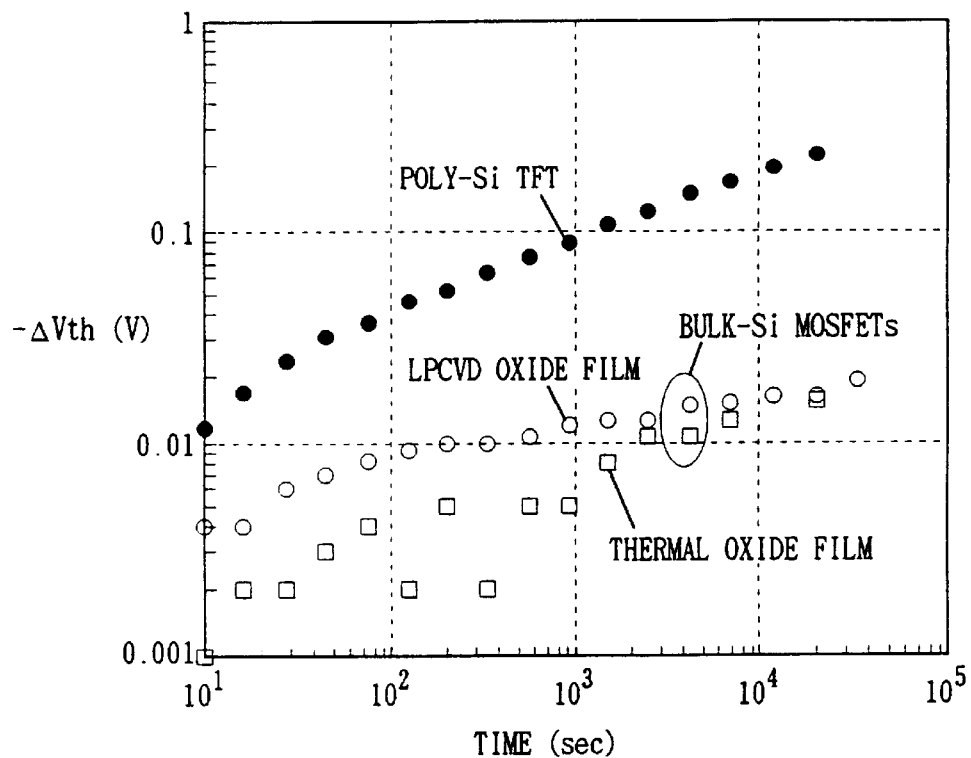
FIG. 3 is a graph showing the time dependence of threshold voltage shift due to −BT stress for TFT and bulk monocrystalline MOSFET.

FIG. 3 is a graph showing the results of −BT stress tests in a bulk monocrystalline MOSFET and a polysilicon TFT. In the graph, the abscissa represents time (sec), and the ordinate represents the amount of shift of threshold voltage −ΔV$_{th}$ (V). Marks ● and ○ represent a polysilicon TFT and a bulk monocrystalline MOSFET, both of which have a gate insulating film formed by LPCVD (Low Pressure Chemical Vapor Deposition). Meanwhile □ represents a bulk monocrystalline MOSFET having an insulating oxide film formed by means of thermal oxidation. The −BT stress condition shown in FIG. 1 was used. It can be seen from FIG. 3 that the amount of shift of threshold voltage −ΔV$_{th}$ of the TFT in the −BT stress test is far larger than the case of the monocrystalline MOSFET. More specifically, in the monocrystalline MOSFET, since the amount of shift of the threshold voltage due to −BT stress is small, degradation due to the −BT stress does not cause any serious problem, but for the polysilicon TFT, the −BT stress causes a significant problem.

The inventors have ascertained the mechanism of threshold voltage shift due to −BT stress in a polysilicon TFT.

Figure 4:
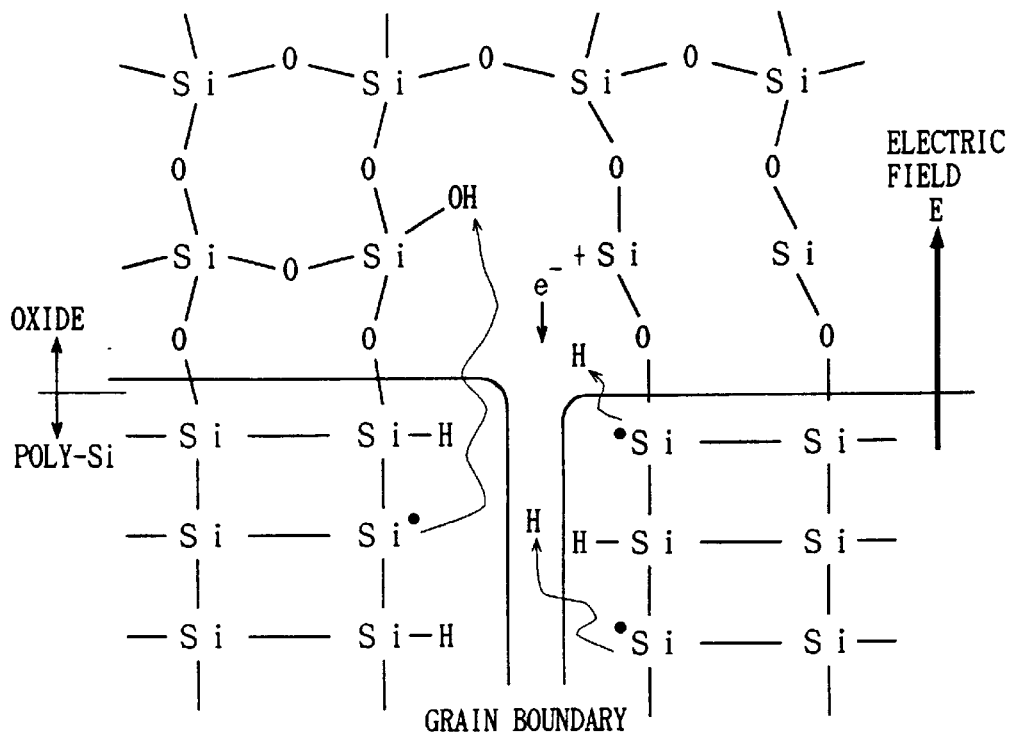
FIG. 4 is a representation for use in illustration of the mechanism of threshold voltage shift of a TFT due to −BT stress.

FIG. 4 illustrates the mechanism of threshold voltage shift due to −BT stress in a polysilicon TFT. This mechanism is understood from FIG. 4 and the following expression (1).

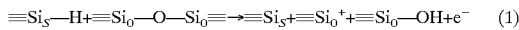

$$\equiv Si_S - H + \equiv Si_O - O - Si_O \equiv \rightarrow \equiv Si_S + \equiv Si_O^+ + \equiv Si_O - OH + e^- \quad (1)$$

More specifically, in polysilicon grain boundaries and the interface of polysilicon and SiO$_2$, hydrogenated dangling bonds of ≡Si$_S$—H and SiO$_2$ network of ≡Si$_O$—O—Si$_O$≡ cause the reaction given by expression (1), and interface trap of ≡Si$_S$ and positive fixed charge of ≡Si$_O^+$ are generated. By the influence of the positive fixed charge, the threshold voltage V$_{th}$ of the TFT shifts toward negative voltage. Herein, Si$_S$ represents silicon atoms in polysilicon and Si$_O$ represents silicon atoms in silicon oxide.

The inventors have found out that the amount of the shift of the threshold voltage can be expressed in a formula. The amount of shift ΔV$_{th}$ of threshold voltage V$_{th}$ when a TFT is supplied with gate voltage V$_G$ and held at absolute temperature T for time t is given by the following expression (2).

$$\Delta V_{th} \propto t^\alpha \exp\left\{-\frac{q}{kT}\left(\phi_0 - \frac{d|V_G|}{2t_{OX}}\right)\right\} \quad (2)$$

where α represents time coefficient, φ$_0$ temperature coefficient, d voltage coefficient, k Boltzmann constant, q elementary electric charge, and t$_{OX}$ the thickness of the gate insulating film.

In the following, a method of estimating the amount of shift of the threshold voltage ΔV$_{th}$ of a TFT due to −BT stress will be described using the above expression (2).

First, the temperature of the TFT is for example set at 125° C., a temperature in the −BT stress state. At the temperature, I$_D$-V$_G$ characteristic is measured and the threshold voltage ΔV$_{th}$ of the TFT is calculated. The threshold voltage at the time is called initial threshold voltage ΔV$_{th0}$.

Then, as illustrated in FIG. 1, at temperature T=125° C., source S and drain D are connected to a potential of 0V and gate G is supplied with a negative voltage of −7V. This state is the −BT stress state, and time for initiating application of the gate voltage is set as t=0.

After passage of prescribed time t, the −BT stress state is released, and threshold voltage V$_{th}$ (t) at time t is measured. After the measurement of threshold voltage V$_{th}$ (t) is completed, the TFT is immediately returned to the −BT stress state. By repeating such measurement of threshold voltage V$_{th}$ (t), a graph as illustrated in FIG. 5 is obtained.

Figure 5:
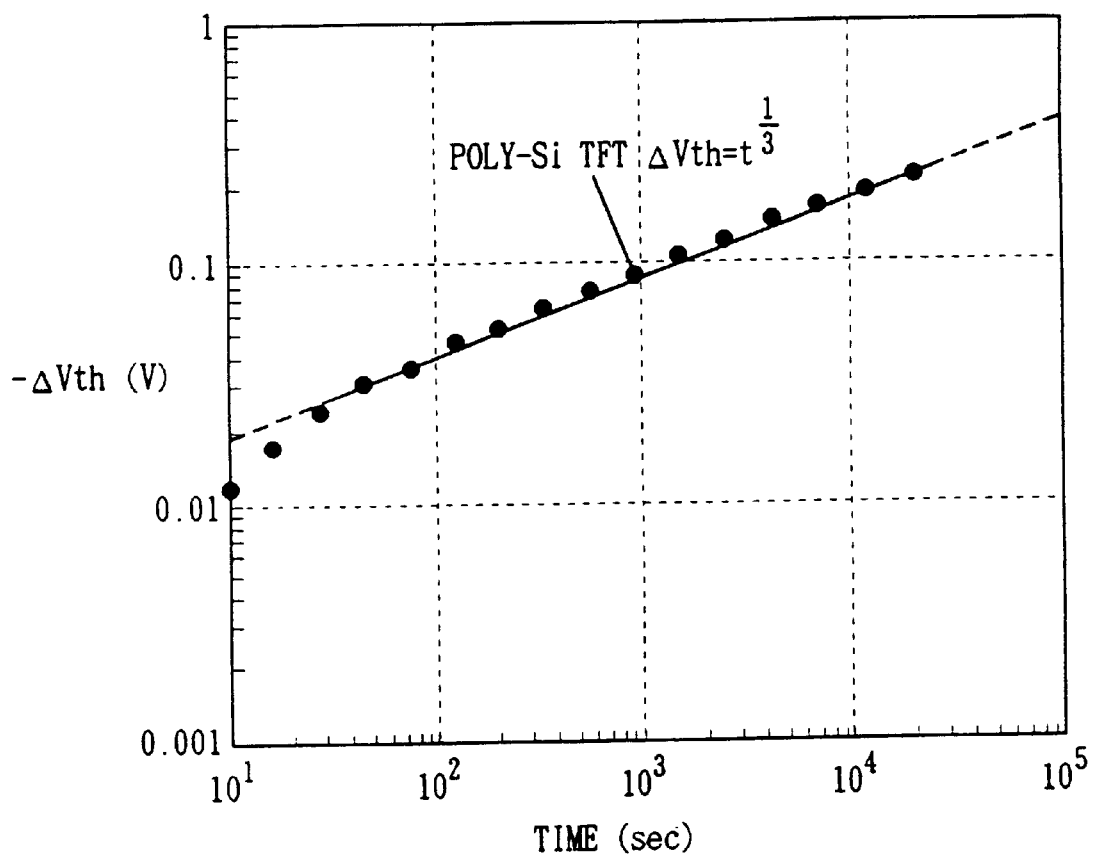
FIG. 5 is a graph showing the relation between time and threshold voltage shift amount in −BT stress.

In FIG. 5, the abscissa represents time (sec), and the ordinate the amount of shift of threshold voltage −ΔV$_{th}$ (V). Herein, the amount of shift of threshold voltage ΔV$_{th}$=ΔV$_{th}$ (t)−ΔV$_{th0}$ holds.

Based on the graph in FIG. 5, time coefficient α in the following expression (3) can be determined.

$$\Delta V_{th} = V_1 t^\alpha \quad (3)$$

where V$_1$ is a constant of proportion. Time coefficient α can be determined more accurately as the −BT stress time is longer, and in the case of FIG. 5, α=⅓ is obtained. Thereafter, a procedure of producing time coefficient α is called process A.

Figure 6:
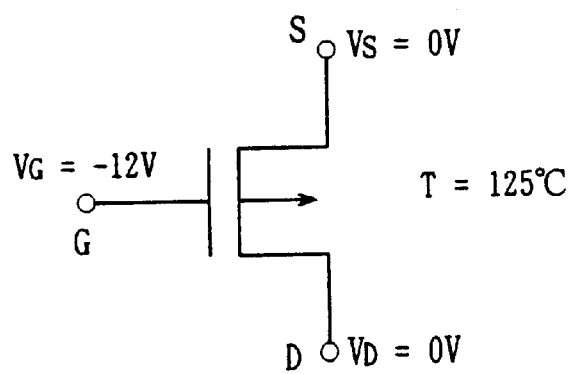
FIG. 6 is a diagram showing another example of −BT tress condition.

Now, in a polysilicon TFT manufactured under the same condition, as illustrated in FIG. 6, a −BT stress test in which a different gate voltage from process A is applied. In the example in FIG. 6, V$_G$=−12V, and the temperature is set to 125° C. which is the same as the case of process A. According to the procedure described in conjunction with process A, the amount of shift of threshold voltage V$_{th}$ is measured.

Figure 7:
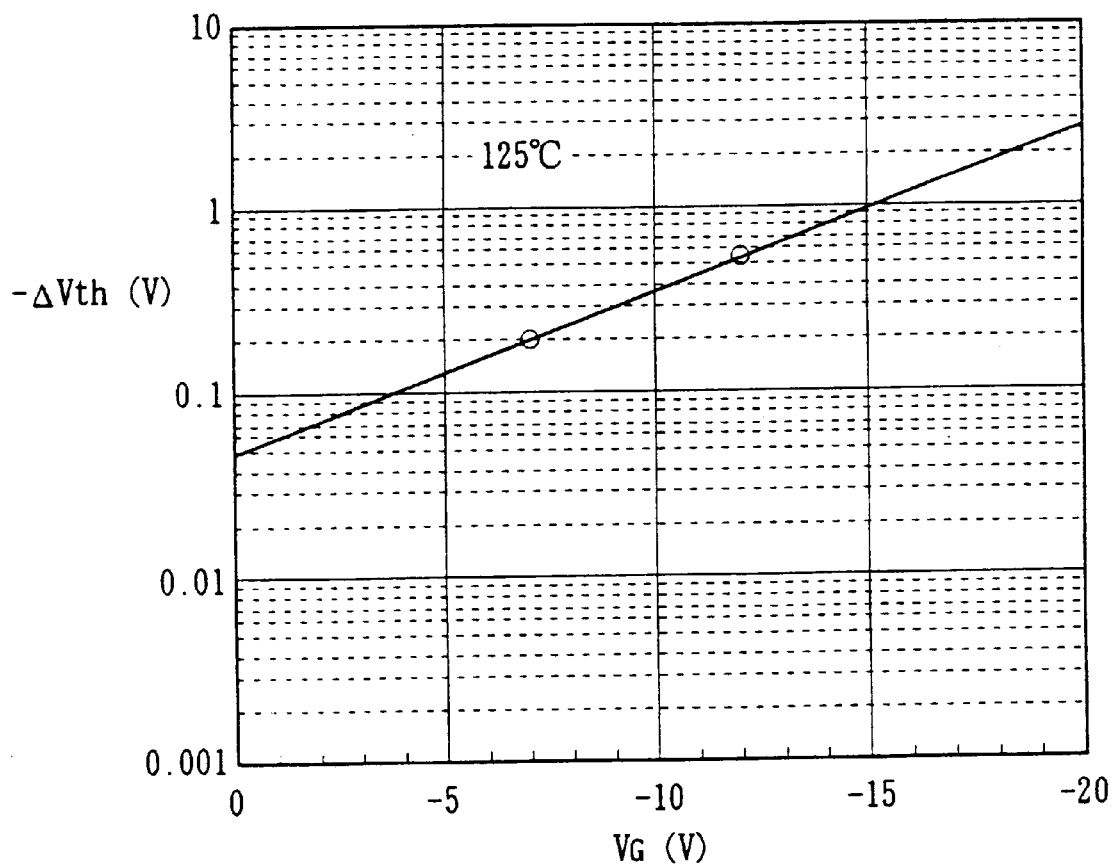
FIG. 7 is a graph showing the relation between gate voltage and threshold voltage shift amount in a −BT stress test.
Figure 17:
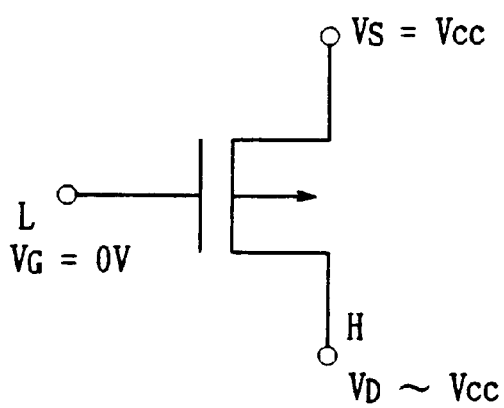
FIG. 17 is a representation for use in illustration of the −BT stress state of a TFT in a memory cell in an SRAM.
Figure 17:
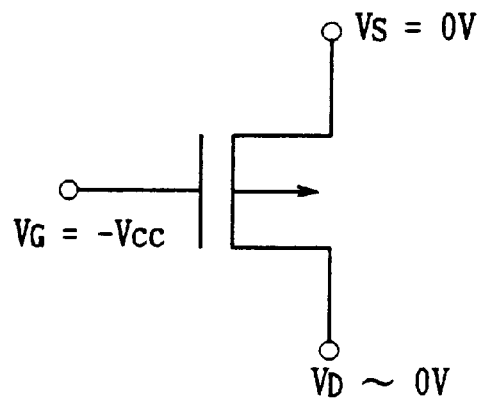

FIG. 7 is a graph showing results of a plurality of −BT stress tests using different gate voltages V$_G$. The abscissa represents gate voltage V$_G$ (V), and the ordinate represents the amount of shift of threshold voltage −ΔV$_{th}$ (V). Mark ○ in the left of the graph represents a test result under the condition in FIG. 1 and mark ○ in the right a test result under the condition of FIG. 6. The test results under these conditions both represent the states after passage of identical time t=t$_0$ after initiation of the tests. In FIG. 17, results at t$_0$=10$^4$ sec are set forth. Based on the graph, voltage coefficient d=3.8 Å in the following expression (4) can be obtained.

$$\Delta V_{th}(t_0) = V_2 \exp\frac{qd|V_G|}{2kTt_{OX}} \quad (4)$$

where V$_2$ is a constant of proportion.

Note that the gate voltages V$_G$ of −7V and −12V were used in FIG. 7, but the value of voltage coefficient d can more accurately be produced by conducting more tests using more different gate voltages V$_G$. In such a plurality of tests for producing voltage coefficient d, the temperature used for these tests must be constant, but needs not be the same as the temperature used in process A.

Hereinafter, the procedure for producing voltage constant d is called process B. Since |V$_G$|/t$_{OX}$ in expression (4) represents electric field, voltage coefficient d can be considered as electric field coefficient. Alternatively, d'=qd/2k may be considered as electric field coefficient.

Figure 8:
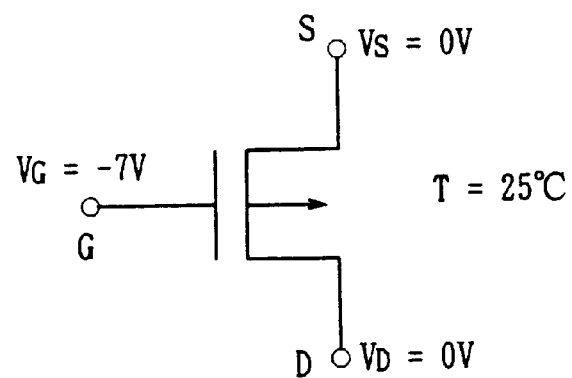
FIG. 8 is a diagram showing another condition in a −BT stress test.

In a polysilicon TFT manufactured under the same condition, as illustrated in FIG. 8, −BT stress test is conducted at a temperature different from the case of process A. In the example of FIG. 8, the temperature of 25° C. is used, and gate voltage is set to V$_G$=−7V which is the same as process A. Under these conditions, change of the amount of shift of threshold voltage ΔV$_{th}$ as a function of time is measured according to the procedure the same as that described in conjunction with process A.

Figure 9:
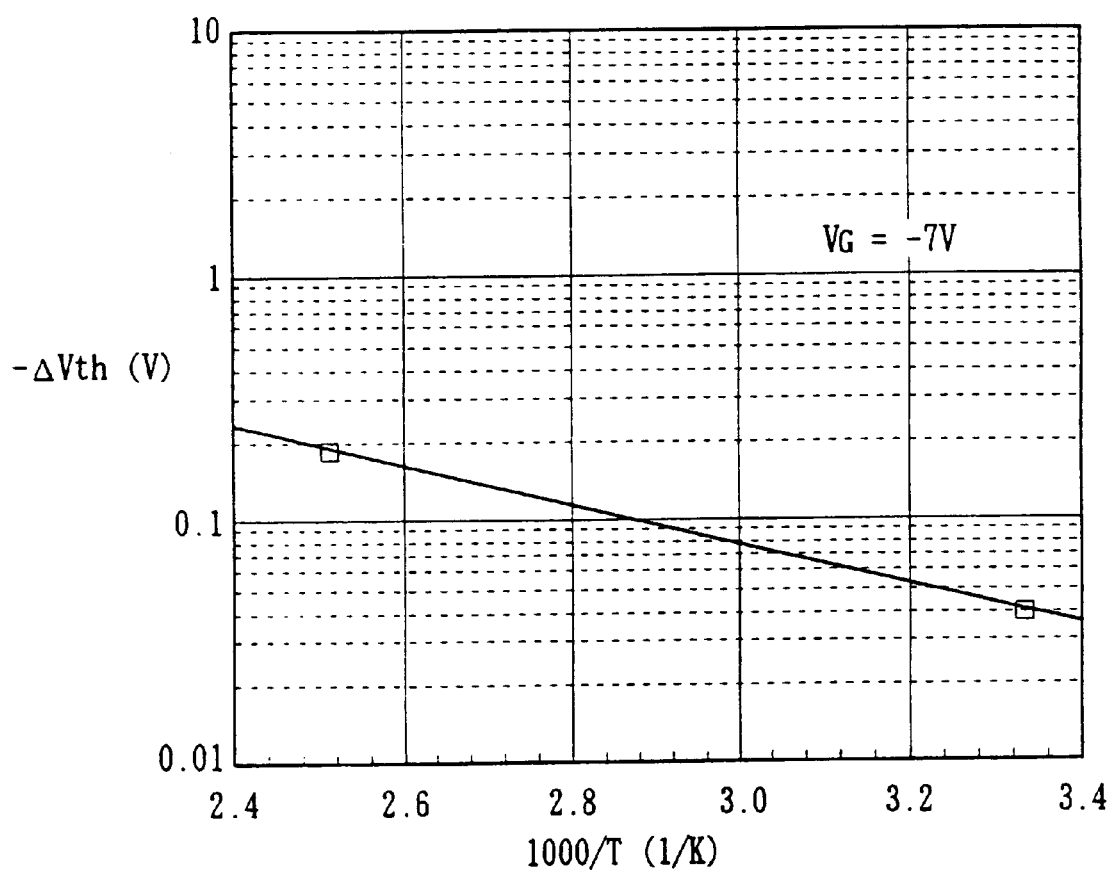
FIG. 9 is a graph showing the relation between temperature and threshold voltage shift amount in a −BT stress test.

FIG. 9 is a graph showing measurement results by the conditions in FIG. 1 and by the conditions in FIG. 8. In the graph, the abscissa represents the inverse number of temperature 1000/T (/K) and the ordinate the amount of shift of threshold voltage $-\Delta V_{th}$ (V). Also in the graph of FIG. 9, a result after passage of $t_0=10^4$ sec since the initiation of the test is set forth. □ in the left represents a result under the conditions in FIG. 1, and □ in the right represents a result under the conditions in FIG. 8. Based on voltage coefficient d obtained in process B and FIG. 9, temperature coefficient $\phi_0$ in the following expression (5) can be obtained.

$$\Delta V_{th}(t_0) = \Delta V_{th0} \exp\left\{-\frac{q}{kT}\left(\phi_0 - \frac{d|V_G|}{2t_{OX}}\right)\right\} \quad (5)$$

In the example of FIG. 9, $q\phi_0=0.23$ eV is obtained. Hereinafter, such a procedure of producing temperature coefficient $\phi_0$ is called process C.

Also in process C, by conducting tests under various more temperature conditions, the value of temperature coefficient $\phi_0$ can more accurately produced. In a plurality of tests in process C, as long as constant gate voltage is used, the voltage used in these tests may be different from the gate voltage in process A.

By the above-described three processes A, B, and C, the amount of shift of threshold voltage $\Delta V_{th}$ due to $-$BT stress in a polysilicon TFT can be estimated based on the following expression (6).

$$\Delta V_{th} = \Delta V_{th0}\left(\frac{t}{t_0}\right)^\alpha \exp\left\{-\frac{q}{kT}\left(\phi_0 - \frac{d|V_G|}{2t_{ox}}\right)\right\} \quad (6)$$

Herein, $t_0$ was $10^4$ sec in the foregoing example, but it goes without saying that any arbitrary appropriate time can be set for $t_0$. Furthermore, even if the value of $t_0$ is different between processes B and C, since time coefficient $\alpha$ is known, the amount of shift of threshold voltage $\Delta V_{th}$ can be produced.

Processes A, B, and C may be conducted in an arbitrary order. In the above-described examples, voltage coefficient d produced in process B is used in process C, but if process C is conducted first, $\phi_E$ defined by the following expression (7) is produced, $$\phi_E \equiv \phi_0 - \frac{d|V_G|}{2t_{OX}} \quad (7)$$

and then $\phi_E$ needs only be transformed into $\phi_0$ using voltage coefficient d produced in process B.

Using expression (6), the amount of shift of threshold voltage $\Delta V_{th}$ after passage of some time t in a $-$BT stress state can be estimated. Conversely, time $\tau$ (the life of TFT) until the amount of shift of threshold voltage $\Delta V_{th}$ reaches ascertain tolerance value $\Delta V_{th\tau}$ can be produced. Substitution of $\Delta V_{th}=\Delta V_{th\tau}$ and $t=\tau$ for expression (6) solves $\tau$ and the following expression (8) results.

$$\tau = t_0\left(\frac{\Delta V_{th\tau}}{\Delta V_{th0}}\right)^\beta \exp\frac{\beta q\phi_0}{kT}\exp\left(-\frac{\beta q d|V_G|}{2kTt_{OX}}\right) \quad (8)$$

where $\beta=1/\alpha$. More specifically, in expression (8), substituting the amount of shift of threshold voltage $\Delta V_{th\tau}$ which is tolerated as a range without causing malfunction of the TFT, gate voltage $V_G$ used, and the value of temperature T for expression (8) can produce the life $\tau$ of the TFT under the $-$BT stress.

Note that the above-described method of evaluating reliability can be applied to a monocrystalline MOSFET.

Figure 10:
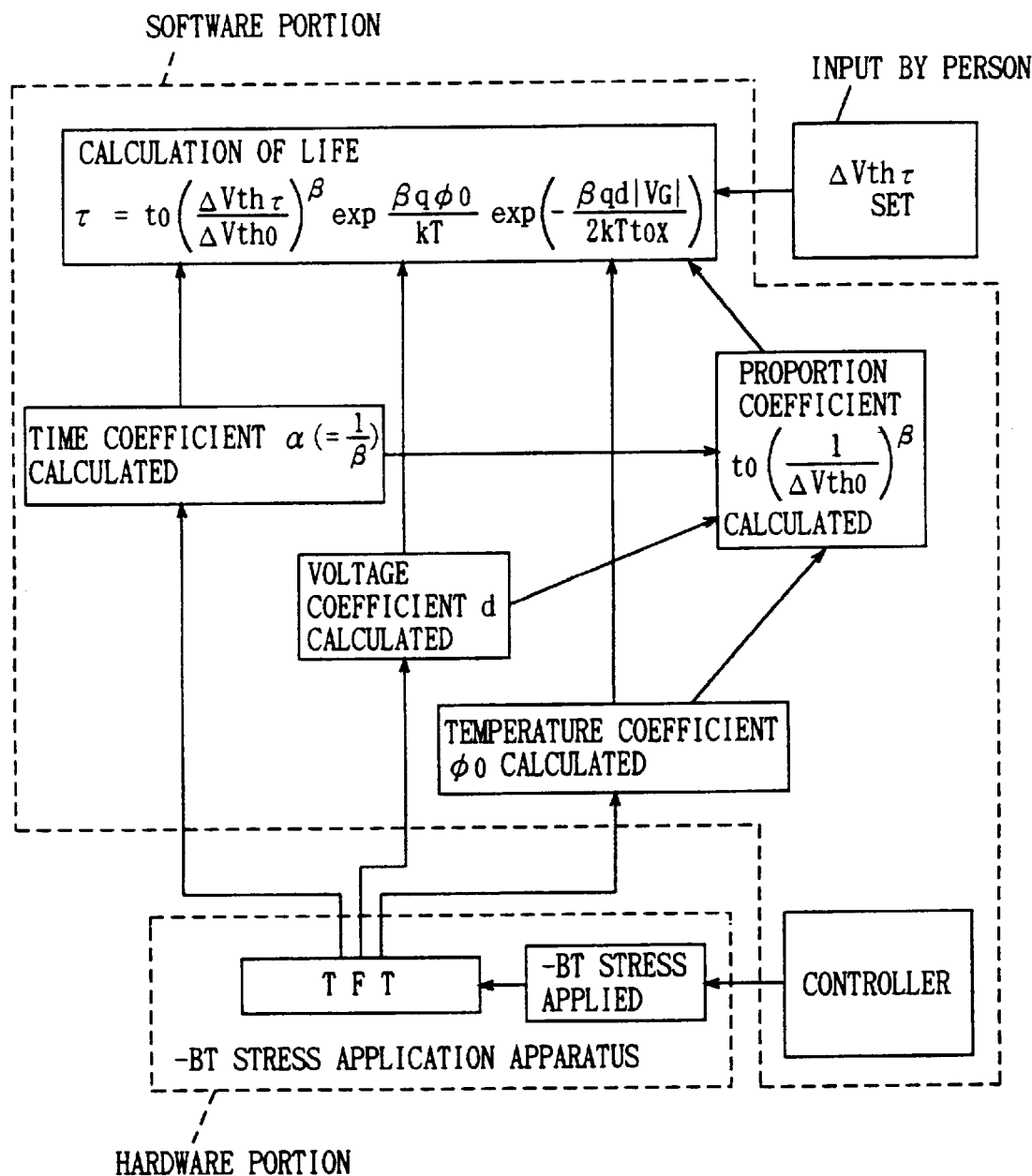
FIG. 10 is a flow chart showing the procedure of a method of evaluating the reliability of a TFT using expression (6)

FIG. 10 is a flow chart showing a procedure in a method of evaluating the reliability of a TFT based on expression (8). In this figure, the procedure of the method of evaluating the reliability of the TFT using expression (8) can be understood visually more clearly.

In the following, one example of a variation of the above-described reliability evaluation method will be described. If time coefficient $\alpha$, voltage coefficient d, temperature coefficient $\phi_0$ and constant of proportion related to the life of a TFT given as follows;

$$t_0\left(\frac{1}{\Delta V_{th0}}\right)^\beta \equiv C_1$$

have been already produced for the TFT (a), for example, the life of another TFT (b) can be estimated as follows.

For TFT (b), at least one $-$BT stress test is conducted, and the amount of shift of threshold voltage $\Delta V_{thb}$ at certain time $t_0$ is obtained. The amount of shift of threshold voltage $\Delta V_{tha}$ for TFT (a) under the same condition is obtained as well. For TFT (a), expression (6) has already been established, $\Delta V_{tha}$ may be produced from expression (6) or produced by actually measuring it.

Once $\Delta V_{thb}$ and $\Delta V_{tha}$ under the same condition are produced, using their ratio, the threshold voltage shift amount and life of TFT (b) under an arbitrary condition can be represented by expressions (6a) and (8a). Note that for coefficient $\beta(=1/\alpha)$, d, and $\phi_0$ in expressions (6a) and (8a), values related to TFT (a) are used.

$$\Delta V_{th} = \Delta V_{th0}\frac{\Delta V_{thb}}{\Delta V_{tha}}\left(\frac{t}{t_0}\right)^\alpha \exp\left\{-\frac{q}{kT}\left(\phi_0 - \frac{d|V_G|}{2t_{ox}}\right)\right\} \quad (6a)$$

$$\tau = t_0\left(\frac{\Delta V_{th\tau}}{\Delta V_{th0}\frac{\Delta V_{thb}}{\Delta V_{tha}}}\right)^\beta \exp\frac{\beta q\phi_0}{kT}\exp\left(-\frac{\beta q d|V_G|}{2kTt_{OX}}\right) \quad (8a)$$

Since coefficients $\beta$, d and $\phi_0$ depend on a method of manufacturing a TFT, if TFTs (a) and (b) are manufactured by significantly different manufacturing methods, it would be difficult to accurately estimate the life of TFT (b), while if there is not much difference between their manufacturing methods, the life of TFT (b) can readily be estimated from expression (8a) utilizing the expression obtained for TFT (a). Furthermore, since time coefficient $\beta$ can be obtained by a single $-$BT stress test, using time coefficient $\beta$ for TFT (b) itself in expression (8a), the life $\tau$ of TFT (b) can more accurately be estimated.

Figure 11:
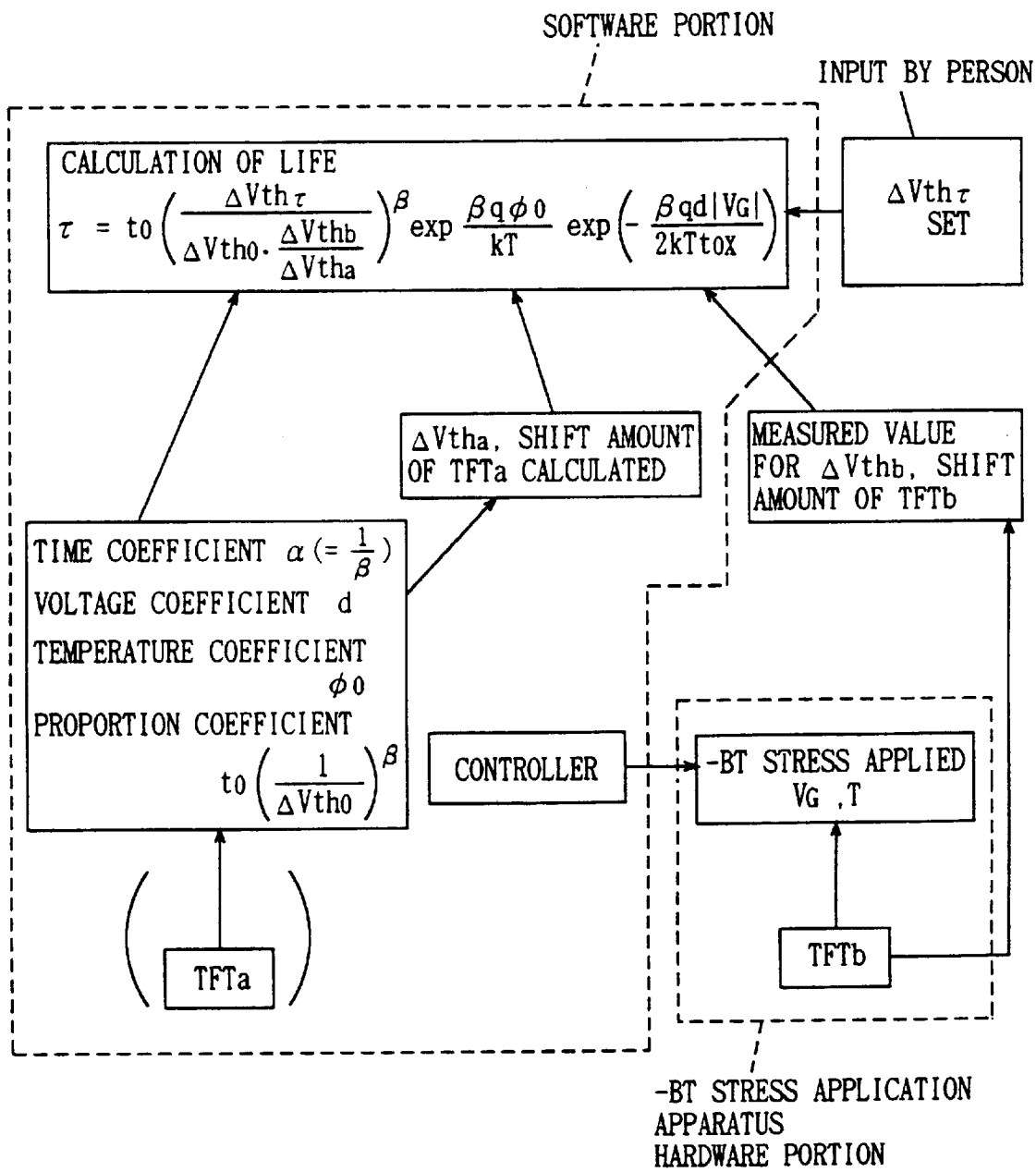
FIG. 11 is a flow chart showing another procedure for readily conducting reliability evaluation for a TFT using the result of the reliability evaluation method shown in FIG. 10.

FIG. 11 is a flow chart for use in illustration of a method of readily estimating the life of a TFT using expression (8a). In this figure, another method of readily estimating the life of TFT (b) using a result of a $-$BT stress test related to another TFT (a) can more visually clearly understood.

If it is not necessary to estimate the life of the TFT at a temperature other than a certain predetermined temperature $T_0$, it will not be necessary to obtain temperature coefficient $\phi_0$ by the above-described process C. At the time, the amount of the threshold voltage shift amount $\Delta V_{th}$ and life $\tau$ of the TFT can be obtained by the following expressions (6b) and (8b).

$$\Delta V_{th} = \Delta V_{th0} \left(\frac{t}{t_0}\right)^\alpha \exp\frac{qd|V_G|}{2kT_0 t_{OX}} \quad (6b)$$

$$\tau = t_0 \left(\frac{\Delta V_{th\tau}}{\Delta V_{th0}}\right)^\beta \exp\left(-\frac{\beta qd|V_D|}{2kT_0 t_{OX}}\right) \quad (8b)$$

Figure 12:
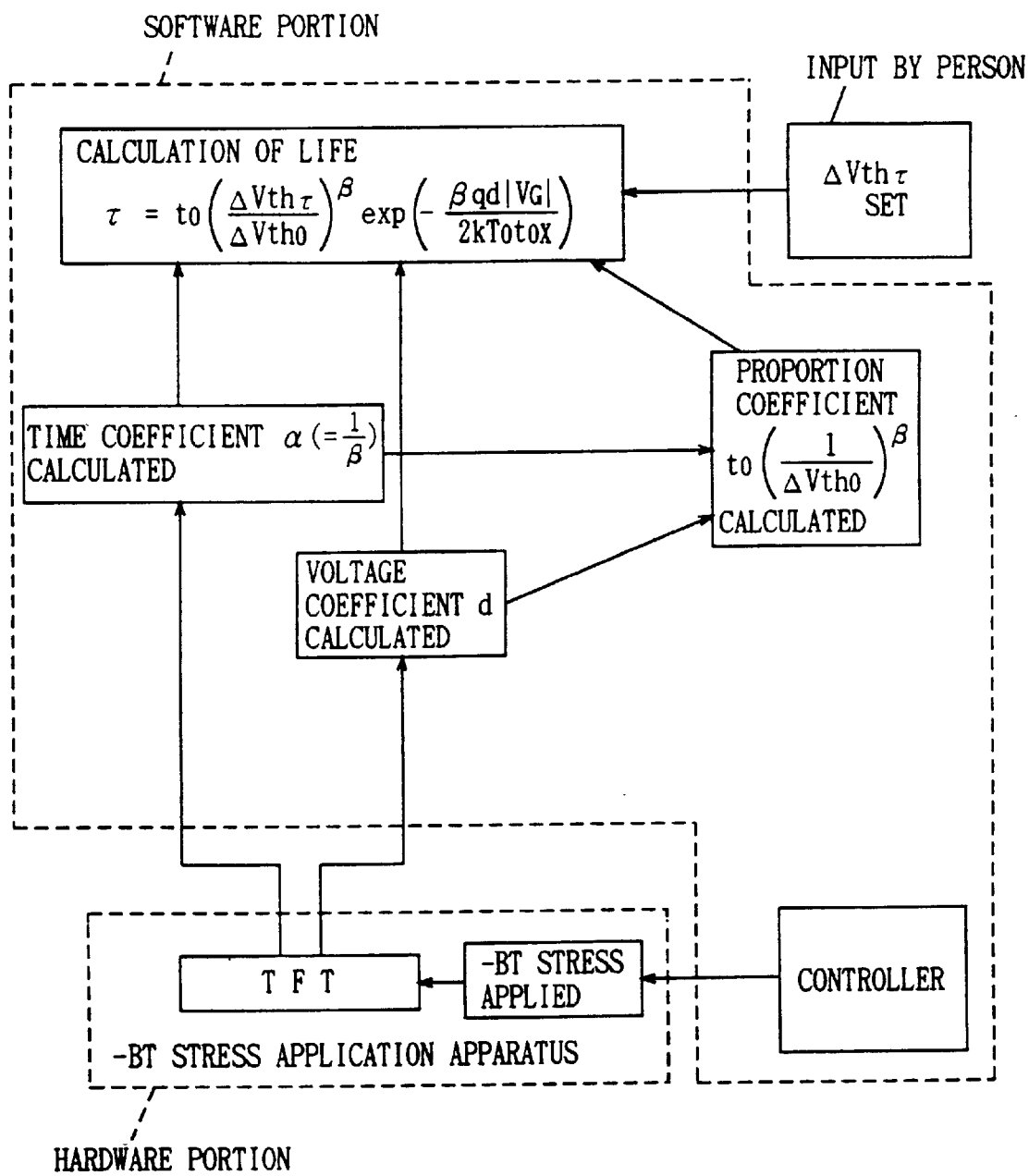
FIG. 12 is a flow chart showing the procedure of a method of evaluating the reliability of a TFT for use at a predetermined temperature.

The procedure of estimation of the life of the TFT in this case is illustrated in the flow chart in FIG. 12.

Figure 13:
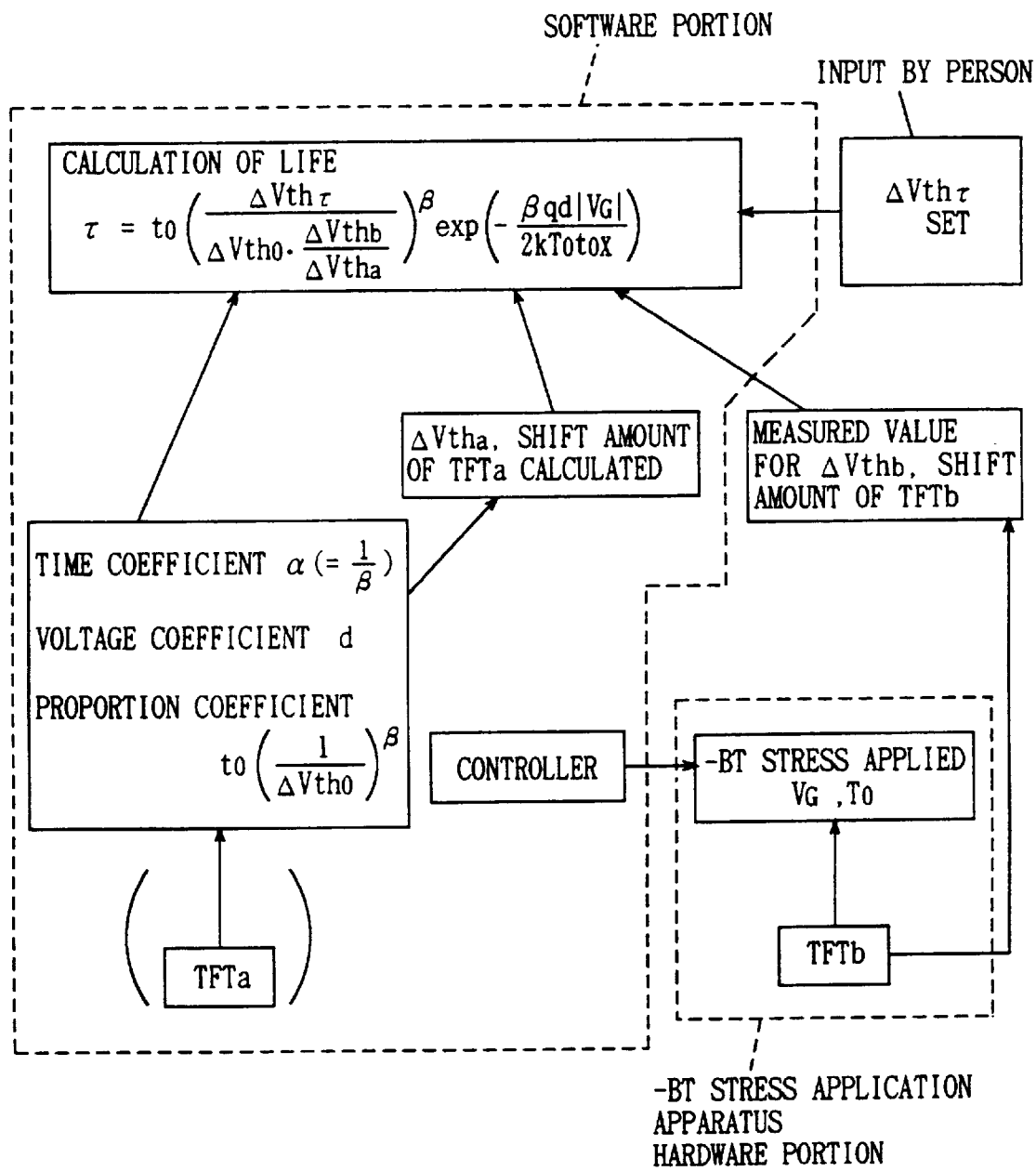
FIG. 13 is a flow chart showing another procedure for readily evaluating the reliability of a TFT utilizing a result obtained by the reliability evaluation method shown in FIG. 12.

Using the result related to TFT (a) obtained by the procedure in FIG. 12, the procedure of another method of estimation for the life of TFT (b) is illustrated in the flow chart in FIG. 13. More specifically, using the threshold voltage shift amounts $\Delta V_{tha}$ and $\Delta V_{thb}$ for TFT (a) and TFT (b) under the same condition, substitution of $\Delta V_{th0} \cdot \Delta V_{thb}/\Delta V_{tha}$ for $\Delta V_{th0}$ in expression (8b) can produce the life $\tau$ of TFT (b).

Furthermore, if it is not necessary to estimate the life of the TFT at voltage other than predetermined gate voltage $V_{G0}$, it will not be necessary to obtain voltage coefficient d in the above-described process B. In this case, the amount of threshold voltage shift $\Delta V_{th}$ and life $\tau$ of the TFT are obtained by following expressions (6c) and (8c).

$$\Delta V_{th} = \Delta V_{th0} \left(\frac{t}{t_0}\right)^\alpha \exp\left(-\frac{q\phi_E}{kT}\right) \quad (6c)$$

$$\tau = t_0 \left(\frac{\Delta V_{th\tau}}{\Delta V_{th0}}\right)^\beta \exp\frac{\beta q\phi_E}{kT} \quad (8c)$$

Figure 14:
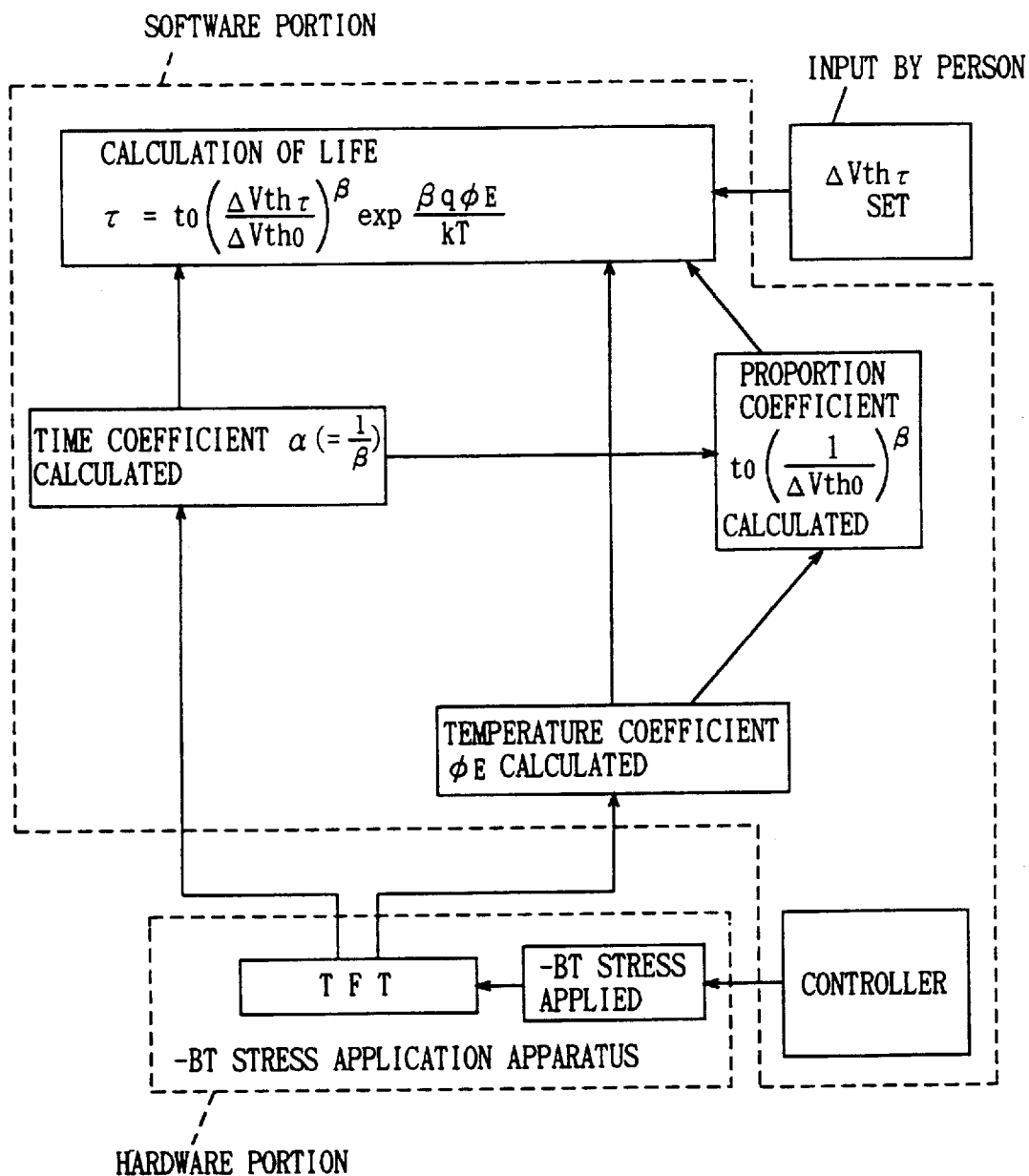
FIG. 14 is a flow chart showing the procedure of a method of evaluating the reliability of a TFT which is used exclusively at certain determined gate voltage.

The procedure in the method of evaluating the reliability of the TFT when it is not necessary to produce voltage coefficient d like this is illustrated in the flow chart in FIG. 14.

Figure 15:
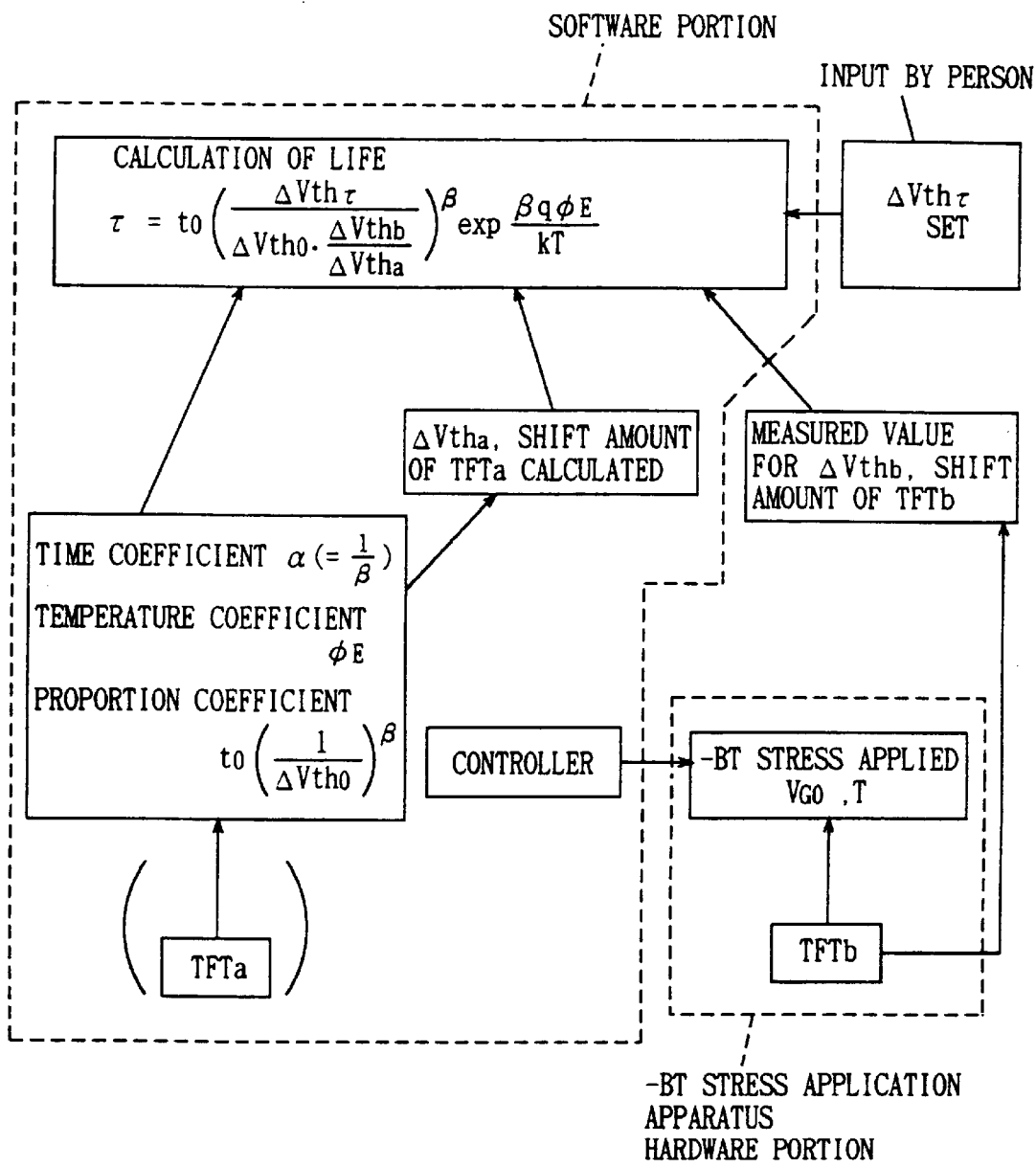
FIG. 15 is a flow chart showing another procedure for readily evaluating the reliability of a TFT using a result obtained by the reliability evaluation method in FIG. 14.

FIG. 15 is a flow chart illustrating the procedure of another method of readily estimating the life of TFT (b) using the result for TFT (a) obtained by the procedure in FIG. 14. More specifically, using threshold voltage shift amounts $\Delta V_{tha}$ and $\Delta V_{thb}$ for TFT (a) and TFT (b) under the same condition, substituting $\Delta V_{th0} \cdot \Delta V_{thb}/\Delta V_{tha}$ for $\Delta V_{th0}$ in expression (8c) can produce the life $\tau$ of TFT (b).

In the following, a method of setting the tolerant amount of threshold voltage shift $\Delta V_{tht}$ in expression (8) related to a TFT used particularly in a memory cell in an SRAM will be described.

Figure 16:
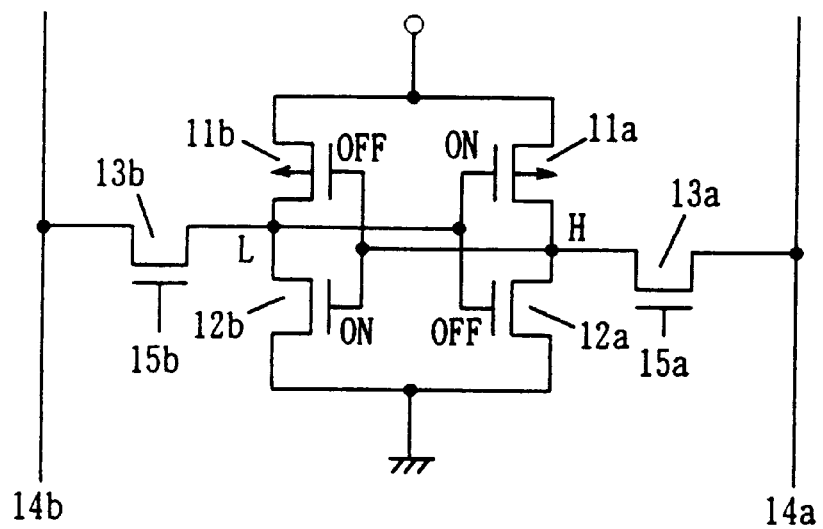
FIG. 16 is an equivalent circuit diagram showing an example of an SRAM memory cell.

In FIG. 16, one example of a memory cell in an SRAM is illustrated in an equivalent circuit diagram. The memory cell in the SRAM stores data by a flipflop including two driver transistors 12a, 12b and two load transistors TFTs 11a, 11b. TFT 11a on the side of H (high level) node in the memory cell in FIG. 16 is in a voltage state shown in FIG. 17 at (A). The voltage state of TFT shown in FIG. 17 at (A) is equivalent to a voltage state shown in FIG. 17 at (B). More specifically, it is understood that TFT 11a in FIG. 16 is in a −BT stress state. More specifically, if data continues to be held at a relatively high temperature and at gate voltage $V_G$ having a relatively large absolute value, the threshold voltage $V_{th}$ of TFT 11a continues to shift toward negative voltage side with time. More specifically, the ON current of TFT 11a decreases with time.

Such shift of threshold voltage $V_{th}$ and decreasing of ON current for the TFT due to the −BT stress will be disadvantageous when the SRAM is driven with low power consumption. When the SRAM is driven with low power consumption, in 1M–4M bit class SRAMs, for example, writing and reading are conducted for power supply voltage $V_{CC}$=3–7V, but even for voltage as low as $V_{CC}$=1.5, data must be at least held. In SRAMs having other bit numbers, data must be held at voltage lower than voltage permitting writing and reading. However, this may not be possible for the shift of threshold voltage $V_{th}$ due to −BT stress.

Now, the operation of a memory cell when power supply voltage $V_{CC}$ is about as low as the threshold voltage of a driver transistor (0.6–1.0V) is considered. In FIG. 16, considering the load transistor on H node side TFT 11a and driver transistors 12a, TFT 11a is in ON state, and driver transistor 12a is in OFF state, and current values for these transistors are very close to each other at low voltage. In this case, if the ON current of TFT 11a decreases due to −BT stress, it becomes close to the same level as the OFF current of driver transistor 12a. In such a case, the potential of H node in FIG. 16 decreases and the ON current of driver transistor 12b on the L (low level) node side which is in ON state decreases. Accordingly, the potential of L node rises. If the potential of L node rises, the ON current of TFT 11a on the H node side further decreases, and the OFF current of driver transistor 12a tends to increase. As a result, the potential of H node further decreases. If such change is repeated, finally inversion of held data results.

Figure 18:
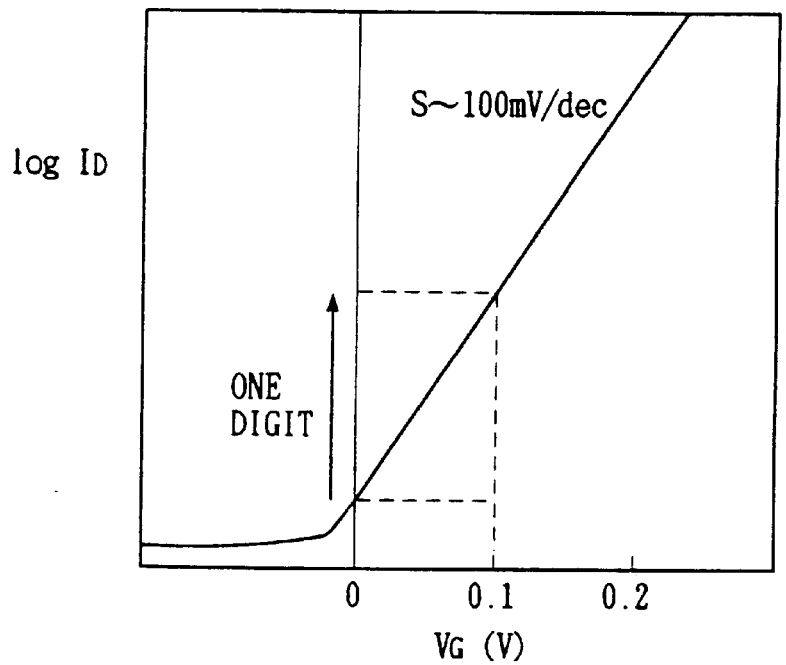
FIG. 18 is a graph showing the $I_D$-$V_G$ characteristic of a driver transistor in a memory cell in an SRAM.

Herein, the OFF current of driver transistor 12a increases about ten times as the potential of the above-described node rises, because as illustrated in FIG. 18, the subthreshold coefficient S of $I_D$-$V_G$ is about 100 mV/dec as the potential of L node rises by 0.1 V.

Driving of an SRAM at low voltage has been described by referring to the case in which power supply voltage $V_{CC}$ is about as low as the threshold voltage of the driver transistor, and since voltage drop is generated also due to wiring resistance in an actual memory cell, TFT degradation due to −BT stress can also be disadvantageous even if higher power supply voltage $V_{CC}$ is used.

It is assumed that at a minimum voltage which guarantees data holding (1.5V in 1M–4M bit class SRAMS) increase of the OFF current of a driver transistor due to increase of the potential of L node is tolerated up to about ten times, and that data is not inverted unless the ON current of the TFT at the minimum voltage is at most ten times as large as the OFF current of the driver transistor.

Figure 19:
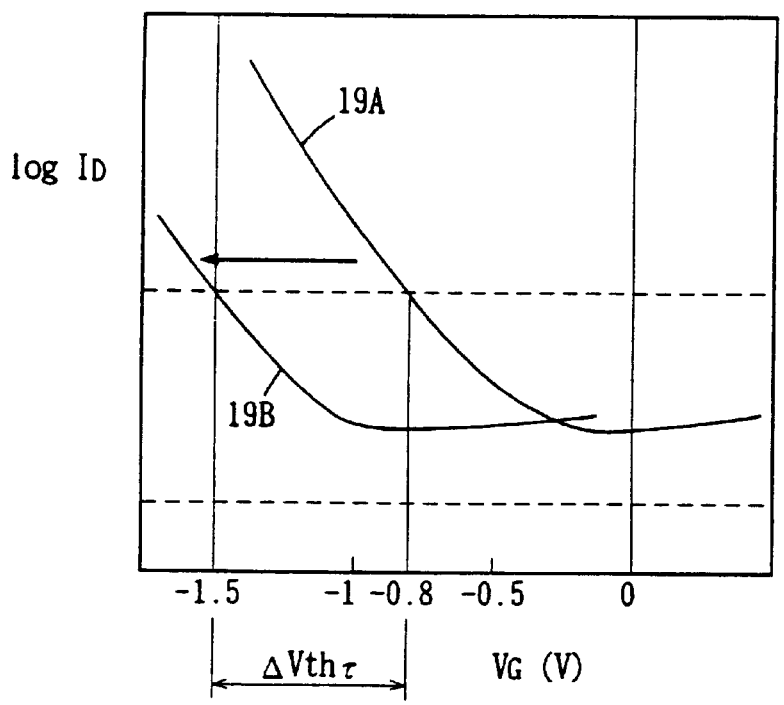
FIG. 19 is a graph showing the $I_D$-$V_G$ characteristic before and after −BT stressing.

FIG. 19 is a graph showing shift in the $I_D$-$V_G$ characteristic of a TFT due to −BT stress. The abscissa represents gate voltage $V_G$ (V), and the ordinate represents drain current $I_D$ in logarithmic scale. Lower and upper dotted horizontal lines represent the OFF current level of the driver transistor and a current level ten times as large, respectively when $V_{CC}$ is sufficiently high. Curve 19A represents a characteristic before −BT stress is applied, and curve 19B represents the state after −BT stress at certain time in which the current value at the minimum voltage of 1.5V to hold data matches the value ten times as large as the OFF current of the driver transistor when power supply voltage $V_{CC}$ is sufficiently large. More specifically, if the $I_D$-$V_G$ characteristic of the TFT shifts to the left from curve 19B, data could be inverted. Accordingly, time until the characteristic of TFT shifts to curve 19B can be defined as the life of the TFT.

In this case, if the threshold voltage $V_{th}$ of the TFT is defined by a constant current method by which current ten times as large as the OFF current of the driver transistor is used as a constant current value (a method by which gate voltage necessary to obtain a set certain constant current value is set to be threshold voltage $V_{th}$), the amount of shift of threshold voltage tolerated $\Delta V_{tht}$ is given by the following expression (9).

$$\Delta V_{th\tau} = V_{CCL} - |V_{th0}| \quad (9)$$

Herein, $V_{CCL}$ indicates a lower limit for power supply voltage. In the case of FIG. 19, if $\Delta V_{th\tau}$=1.5−|−0.8|=0.7V, and the threshold voltage shift due to −BT stress is at most 0.7V, there will be no possibility of inversion of data. Accordingly, for an SRAM driven with low power consumption, the life of a TFT under −BT stress can be obtained by substituting the value of $\Delta V_{th}$ defined in expression (9) for expression (6).

Now, a method of determining the tolerant amount of shift of threshold voltage $\Delta V_{thr}$ for a TFT used in an SRAM memory cell driven at a high speed will be described. In FIG. 16, data writing will be considered. When data is written, access transistors 13a, 13b are turned on and a bit line connected to a node to be written with L among bit lines 14a, 14b in H state is pulled to 0V. However, at the node on the other H side, voltage will not completely increase to the level of power supply voltage $V_{CC}$ and decreases by the amount corresponding to the threshold voltage $V_{th}$ of the access transistor. At the time, the portion corresponding to the decrease of the voltage is compensated for by the ON current of the TFT. Accordingly, if the ON current of the TFT is reduced due to −BT stress, time required for charging the node on the H side is prolonged. It is therefore necessary to previously set tolerant time required for charging the node and the ON current of the TFT must be maintained so as not to exceed the tolerant time. For example, for the capacity of the storage node=5 fF and the threshold voltage $V_{th}$ of the access transistor=1V, it is pointed out that 5 fF×1V/5 nano seconds=1 μA or larger current is necessary in order to charge the node in 5 nano seconds. Such minimum necessary current value is hereinafter called standard current value $I_1$.

When an SRAM is driven at a high speed, it will not be operated with low voltage and therefore the graph in FIG. 19 is of no use.

Figure 20:
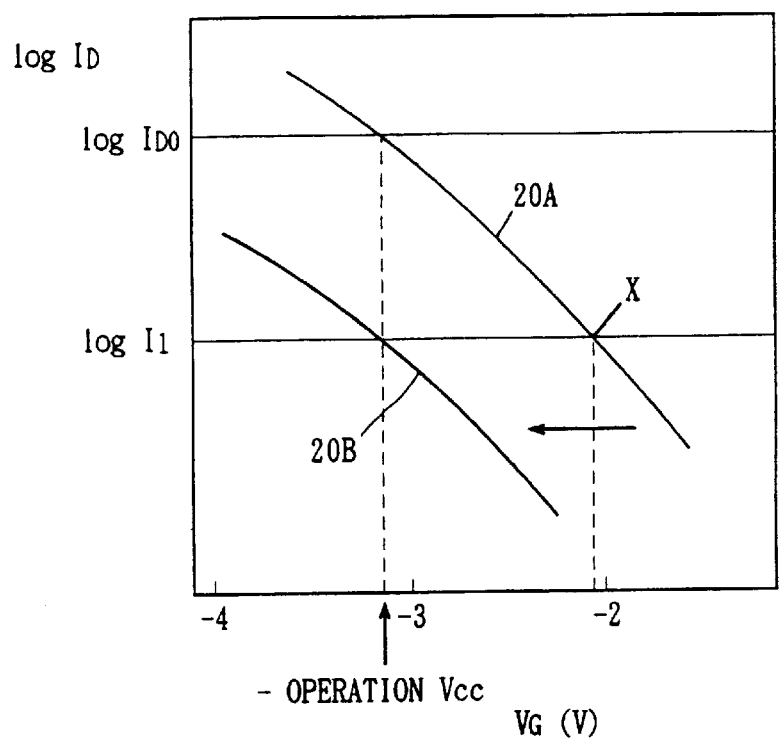
FIG. 20 is a graph showing another example of the $I_D$-$V_G$ characteristic of a TFT before and after −BT stressing.

FIG. 20 is a graph showing change of the $I_D$-$V_G$ characteristic of a TFT due to −BT stress. Curve 20A represents an initial characteristic and drain current at $|V_G|$=operation $V_{CC}$ is identified as $I_{D0}$. Curve 20B represents the characteristic when drain current $I_D$ at $|V_G|$=operation $V_{CC}$ is equal to standard current value $I_1$ after shifting toward negative voltage due to −BT stress. More specifically, if the $I_{-VG}$ characteristic shifts further toward the negative voltage side from curve 20B, it will not be possible to charge the storage node with the ON current of the TFT within a prescribed time period.

Accordingly, if the threshold voltage $V_{th}$ of the TFT is determined by the constant current method with standard current value $I_1$ being the constant current value, the tolerant amount of shift of threshold voltage $\Delta V_{thr}$ is given by following expression (10).

$$\Delta V_{thr} = \text{Operation } V_{CC} - |V_{th0}| \quad (10)$$

The tolerant amount of shift of threshold voltage $\Delta V_{thr}$ can also be given by the following approximate expression.

In FIG. 20, the intersection of initial characteristic 20A and standard current value $I_1$ is X and the slope of curve 20A at point X is S. Herein, slop S is expressed in mv/dec as in the case of the subthreshold coefficient. If the initial current value of the drain is $I_{D0}$, the following expression is given.

$$\Delta V_{thr} \approx (\log I_{D0} - \log I_1) \times S \quad (11)$$

Substituting the value of tolerant threshold voltage shift amount $\Delta V_{thr}$ produced from the above expression (10) or (11) in expression (6) makes it possible to evaluate the −BT stress life of the TFT in the SRAM driven at a high speed.

SRAMs undergo burn-in tests before being marketed. The burn-in test is to generate defects in unstable semiconductor circuit chips by maintaining semiconductor circuit chips at a high temperature and high voltage, so that such semiconductor chips including the defects are avoided from being marketed.

Burn-in tests include a static burn-in test and a dynamic burn-in test. In the dynamic burn-in test, data is periodically rewritten at a high temperature and under high voltage. On the other hand, in the static burn-in test, data may be maintained as constant.

For ease of representation, in the case of the static burn-in test, TFT on the node side at which H is written attains a −BT stress state, and therefore its threshold voltage $V_{th}$ shifts toward negative voltage.

Figure 21:
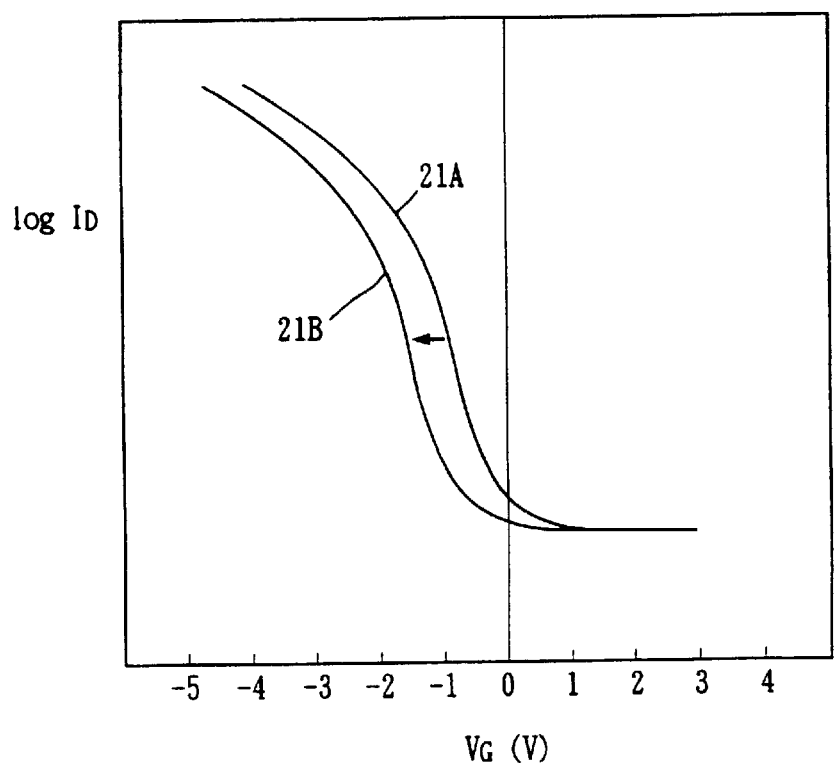
FIG. 21 is a graph showing the $I_D$-$V_C$ characteristic of a TFT before and after a burn-in test.
Figure 22:
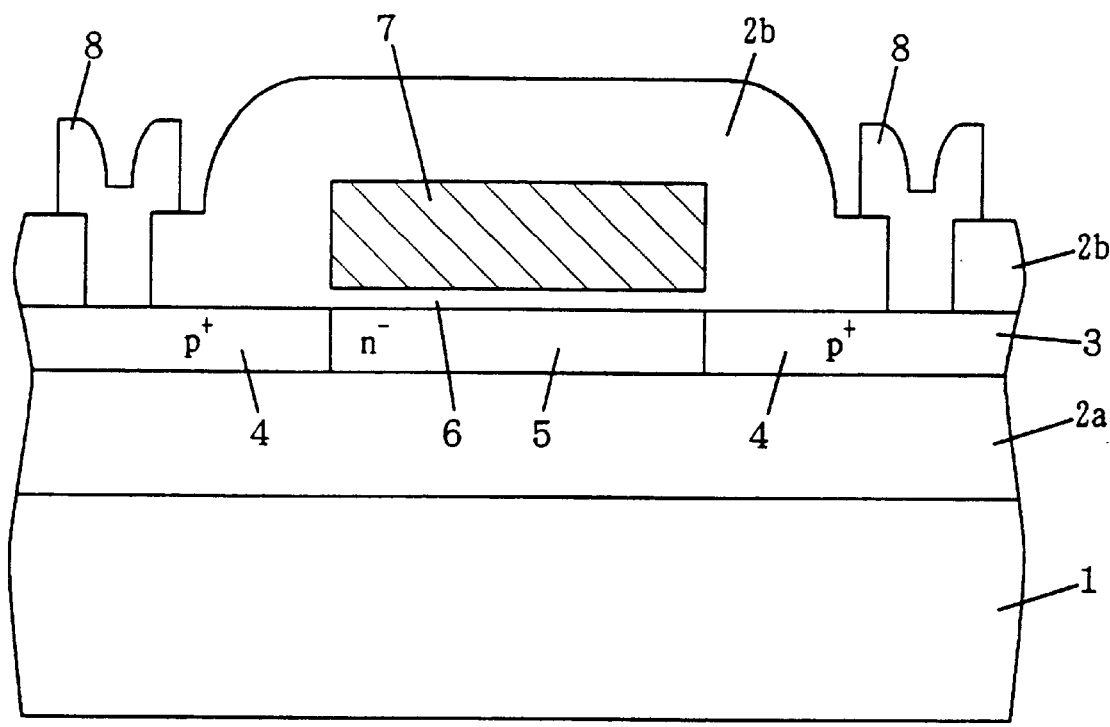
FIG. 22 is a cross sectional view schematically showing one example of a TFT.

FIG. 21 is a graph showing change of the $I_D$-$V_G$ of a TFT by a burn-in test. Curve 21A represents an initial characteristic. Curve 21B shows the characteristic of the TFT on the H node side after a static burn-in test. When threshold voltage shift by the static burn-in test as in this graph is estimated from expression (6) and the threshold voltage $V_{th}$ of the TFT is previously set shifted toward positive voltage side by the amount of the estimated shift, the problem of the threshold voltage shift due to such a static burn-in test can be solved. Initial threshold voltage $V_{th}$ can be controlled by adjusting impurity concentration in the channel of the TFT.

However, since only the TFT on the H node side attains a −BT stress state, the threshold voltage $V_{th}$ of the other TFT should be shifted by inverting the data of all the bits when the static burn-in test is half completed. More specifically, it has been found out that the characteristic of the TFT on the L node side hardly changes by a burn-in test.

In addition, in the case of a dynamic burn-in test, since H and L sides are exchanged alternately, for one TFT, only time periods when it attains H needs to be multiplied to set initial threshold voltage $V_{th}$ taking into account threshold voltage shift amount $\Delta V_{th}$ by expression (6).

Now, a TFT with a gate oxide film having a thickness permitting implementation of a maximum −BT stress life will be described. Under −BT stress, positive fixed charge $\equiv Si_0^+$ is generated in the gate oxide film in the vicinity of the interface between gate oxide film and the channel. For the density of fixed charge $N_{SC}$ and gate capacitance $C_{OX} = \epsilon_{OX}/t_{OX}$, threshold voltage shift amount $\Delta V_{th0}$ is given by the following expression (12).

$$\Delta V_{th0} = \frac{qN_{SC}}{C_{OX}} = \frac{qN_{SC}t_{OX}}{\varepsilon_{OX}} \quad (12)$$

where $\epsilon_{OX}$ represents the dielectric constant of $SiO_2$.

Accordingly, as the thickness $t_{OX}$ of the gate oxide film increases, threshold voltage shift amount $\Delta V_{th0}$ increases in proportion to the thickness $t_{OX}$ of the gate oxide film. However, it can be seen from expression (6) that as the thickness $t_{OX}$ of the gate oxide film increases, the influence of gate voltage $V_G$ decreases and therefore threshold voltage shift amount $\Delta V_{th}$ decreases.

Using expression (12), expressions (6) and (8) are transformed into the following expressions (6d) and (8d), respectively.

$$\Delta V_{th} = \frac{qN_{SC}t_{OX}}{\varepsilon_{OX}}\left(\frac{t}{t_0}\right)^\alpha \exp\left\{-\frac{q}{kT}\left(\phi_0 - \frac{d|V_G|}{2t_{OX}}\right)\right\} \quad (6d)$$

$$\tau = t_0 \times \left(\frac{\Delta V_{th\tau}}{\frac{qN_{SC}t_{OX}}{\varepsilon_{OX}}}\right)^\beta \exp\frac{\beta q\phi_0}{kT}\exp\left(-\frac{\beta q d|V_G|}{2kTt_{OX}}\right) \quad (8d)$$

It can be seen that with temperature T and $V_G$ being constant, from expression (6d) threshold voltage shift amount $\Delta V_{th}$ is minimized for a certain thickness $t_{OX}$ of the gate oxide film. From expression (8d), the –BT stress life $\tau$ of the TFT is maximized for a certain thickness $t_{OX}$ of the gate oxide film provided that T, $V_G$ and $\Delta V_{th\tau}$ are constant.

More specifically, when expression (8d) is differentiated with $t_{OX}$ to produce $[\partial\tau/\partial t_{OX}]_{tOX=tOX-opt}=0$ the following expression is given.

$$t_{OX} = qd|V_C|/2kT \quad (13)$$

This means that the –BT stress life $\tau$ is maximized when the gate insulating film has this thickness.

For example, for a TFT at $V_G=-3.3V$ and operation temperature T=120° C., from expression (13), its –BT stress life is maximized at $t_{ox-opt}=185$ Å. For a TFT used at $V_G=-3.3V$ and operation temperature T=77° C., its –BT stress life is maximized when $t_{ox-opt}=208$ Å. However, in practice, the life of a TFT is substantially maximized at a tolerance of +10% for the thickness obtained from expression (13).

In the above description, the operation temperature of the TFT means the temperature of the TFT itself. Stated differently, even for a TFT operated in a room temperature atmosphere, if the semiconductor chip generates heat and the temperature of the TFT itself is 77° C., the operation temperature of the TFT is 77° C.

Figure 25:
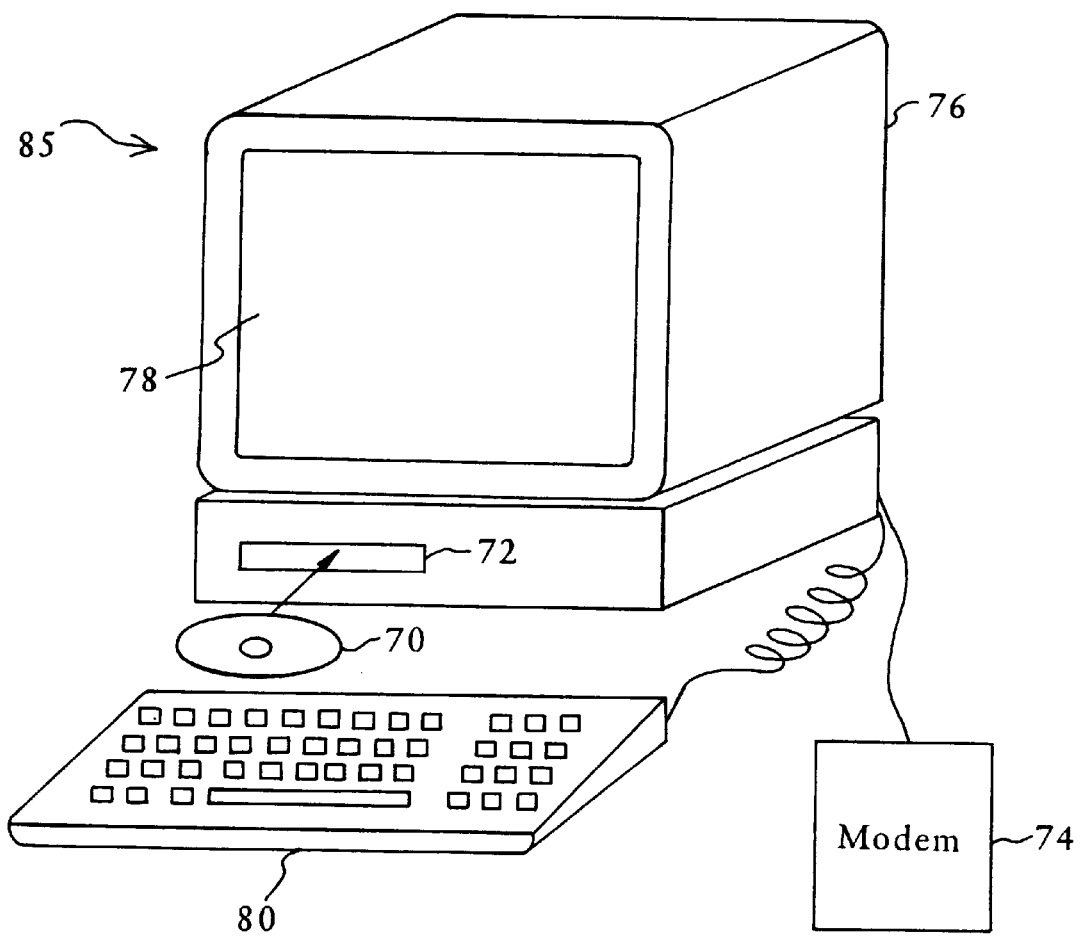
FIG. 25 shows apparatus for performing the calculations of the present invention.

FIG. 25 shows apparatus for performing the calculations described in connection with the present invention. The apparatus includes a standard computer arrangement 85 having a conventional central processing unit (CPU) (not shown), a random access memory (not shown), and a hard disk drive (not shown) each installed within housing 76, a display 78, a keyboard 80, a modem 74 for transmitting signals to/from the computer 85 over a telephone network (not shown), and a CD-ROM drive 72 into which a CD-ROM 70 can be inserted. CD-ROM 70 is one example of a machine-readable medium storing a machine executable software procedure for performing the calculations described in connection with the present invention. Other types of machine-readable media could be used for storing the machine executable software procedure such as the computer's floppy disk, a read only memory (ROM) chip, etc. Another medium for storing the machine executable software procedure is the computer's resident memory loaded from the hard disk of the floppy disk, a remote drive or ROM, or downloaded form a remote source over the telephone network via the modem 74 or on an ISDN line As described above, according to the present invention, the threshold voltage shift amount and life of a polysilicon TFT due to –BT stress are estimated using expressions based on the mechanism of threshold voltage shift, and therefore an accurate and efficient method of evaluating the reliability of a TFT can be provided.

Furthermore, employing the method of reliability evaluation according to the present invention, a TFT with threshold voltage $V_{th}$ set taking into account burn-in conditions can be provided.

Furthermore, employing the method of reliability evaluation according to the present invention, a TFT including a gate insulating film having a thickness achieving a maximum useful life for each –BT stress condition in which the TFT is used can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of determining an optimized gate insulating film thickness $t_{ox-opt}$ of a TFT having a channel layer of a polycrystalline thin film and a gate insulating film of a silicon oxide film and used at an absolute temperature T during operation, comprising the steps of:

determining voltage coefficient d using the equation $$\Delta V_{th} \propto \exp\frac{qd|V_G|}{2kTt_{OX}}$$

and determining $t_{ox-opt} = qd\ VG_{burn-in}/2kT$ using the determined voltage coefficient d.

2. A machine-readable medium storing a machine executable software procedure for determining an optimized gate insulating film thickness $t_{ox-opt}$ of a TFT having a channel layer of a polycrystalline thin film and a gate insulating film of a silicon oxide film and used at an absolute temperature T during operation, the machine executable software procedure comprising the steps of:

determining voltage coefficient d using the equation $$\Delta V_{th} \propto \exp\frac{qd|V_G|}{2kTt_{OX}}$$

and determining $t_{ox-opt} = qd\ VG_{burn-in}/2kT$ using the determined voltage coefficient d.

3. A machine-readable medium storing a machine executable software procedure for evaluating the reliability of a TFT in a –BT stress state, the TFT having a channel layer of a silicon thin film and a gate insulating film of a silicon oxide, and in the –BT stress state a gate is supplied with arbitrary constant voltage $V_G$ and held at an arbitrary constant temperature T based on the following expressions:

$$\Delta V_{th}\ t^\alpha \quad (i)$$

$$\Delta V_{th} \propto \exp\frac{qd|V_G|}{2kTt_{ox}} \quad (ii)$$

$$\Delta V_{th} \propto \exp\left\{-\frac{q}{kT}\left(\varnothing_0 - \frac{d|V_G|}{2t_{ox}}\right)\right\} \quad (iii)$$

$$\Delta V_{th} = \Delta V_{tho}\left(\frac{t}{t_0}\right)^\alpha \exp\left\{-\frac{q}{kT}\left(\varnothing_0 - \frac{d|V_G|}{2t_{ox}}\right)\right\} \quad (iv)$$

$$\tau = t_0\left(\frac{\Delta V_{th\tau}}{\Delta V_{th}0}\right)^\beta \exp\frac{\beta q\varnothing_0}{kT}\exp\left(-\frac{\beta qd|V_G|}{2kTt_{ox}}\right) \quad (v)$$

where $\Delta V_{th}$ represents the threshold voltage shift amount of the TFT, t time, $\alpha$ time coefficient, q elementary electric charge, d voltage coefficient, k Boltzman constant, $t_{OX}$ the thickness of the gate oxide film $\Phi_0$ temperature coefficient, and $\Delta V_{th\tau}$ the tolerant threshold voltage shift amount of the TFT, and $\beta=1/\alpha$, the machine executable software procedure comprising the steps of:

determining the time coefficient α in expression (i) based on the relation between a threshold voltage shift amount $\Delta V_{th}$ obtained from at least one −BT stress test and time t;

determining coefficient d in expression (ii) based on the relation between a threshold voltage shift amount $\Delta V_{th}$ obtained from at least two −BT stress tests and different gate voltages $V_G$ applied in the tests;

determining the temperature coefficient $\Phi_0$ in expression (iii) based on the relation between a threshold voltage shift amount $\Delta V_{th}$ obtained from at least two −BT stress tests and different temperatures T used in the tests; and determining the following constant of proportion in expression (iv) obtained from the relation between expressions (i) and (ii), using the determined time coefficient α, voltage coefficient d and temperature coefficient $\Phi_0$, $$\Delta V_{th} 0 \left(\frac{1}{t_0}\right)^\alpha = C_2$$

thereby obtaining the life of the TFT from expression (v) obtained by transforming expression (iv) using the determined constant of proportion $C_2$ and the tolerant threshold voltage shift amount $\Delta V_{th\tau}$ of the TFT.

4. The machine-readable medium as recited in claim 3, wherein in BT stress tests for TFTs (a) and (b), the threshold voltage shift amounts $\Delta V_{tha}$ and $\Delta V_{thb}$ of the TFTs (a) and (b) at the same temperature T and the same gate voltage $V_G/t_{ox}$ at certain time t are produced, and the life of the TFT (b) is estimated by replacing $\Delta V_{tho}$ in expression (v) obtained for the TFT (a) with $\Delta V_{th0}\Delta V_{thb}/\Delta V_{tha}$.

5. The machine-readable medium as recited in claim 3, wherein for a TFT in an SRAM memory cell, the threshold voltage of the TFT is determined according to a constant current method based on the current value of the TFT determined from the OFF current of bulk monocrystalline transistors arranged to form a CMOS inverter, and the difference between an initial threshold voltage thus determined and minimum power supply voltage necessary for guaranteeing data holding in said memory cell is used as a value for $\Delta V_{th\tau}$.

* * * * *